United States Patent
Kasuya et al.

(10) Patent No.: US 8,967,367 B2
(45) Date of Patent: Mar. 3, 2015

(54) ARTICLE TRANSPORT FACILITY

(71) Applicant: Daifuku Co., Ltd., Osaka-shi (JP)

(72) Inventors: Toru Kasuya, Komaki (JP); Masaru Satou, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 97 days.

(21) Appl. No.: 13/899,831

(22) Filed: May 22, 2013

(65) Prior Publication Data
US 2013/0313071 A1    Nov. 28, 2013

(30) Foreign Application Priority Data

May 23, 2012   (JP) .................................. 2012-117885

(51) Int. Cl.
| | | |
|---|---|---|
| B65G 43/08 | (2006.01) | |
| B65G 35/06 | (2006.01) | |
| B61B 13/00 | (2006.01) | |
| B60L 5/00  | (2006.01) | |
| H01L 21/67 | (2006.01) | |
| H01L 21/677| (2006.01) | |

(52) U.S. Cl.
CPC ............... B65G 35/06 (2013.01); B61B 13/00 (2013.01); B60L 5/005 (2013.01); H01L 21/67259 (2013.01); H01L 21/67706 (2013.01); H01L 21/67727 (2013.01); H01L 21/6773 (2013.01); H01L 21/67733 (2013.01); H01L 21/67736 (2013.01)
USPC ..................................... 198/465.4; 198/465.3

(58) Field of Classification Search
CPC ...... B65G 17/20; B65G 47/61; B65G 17/485; B65G 1/0457; B65G 35/08; B65G 35/06
USPC ................. 198/465.4, 465.3, 678.1, 684, 685
See application file for complete search history.

(56) References Cited

U.S. PATENT DOCUMENTS

| | | | | |
|---|---|---|---|---|
| 3,580,377 A | * | 5/1971 | Kiehl | 198/464.1 |
| 5,996,771 A | * | 12/1999 | Estes | 198/686 |
| 7,178,661 B2 | * | 2/2007 | Tabler | 198/465.3 |
| 7,377,377 B2 | * | 5/2008 | Christiansson | 198/465.4 |
| 7,556,139 B2 | * | 7/2009 | Tsuruya et al. | 198/465.4 |
| 8,448,579 B2 | * | 5/2013 | Inui | 104/288 |
| 8,701,864 B2 | * | 4/2014 | Ogawa et al. | 198/370.1 |
| 2009/0078535 A1 | * | 3/2009 | Tabler | 198/465.3 |
| 2010/0242784 A1 | * | 9/2010 | Oguro et al. | 104/130.01 |

FOREIGN PATENT DOCUMENTS

JP         2011116313 A      6/2011

* cited by examiner

*Primary Examiner* — James R Bidwell
(74) *Attorney, Agent, or Firm* — The Webb Law Firm

(57) ABSTRACT

An article transport facility includes an article transport vehicle and a rotatable member transporting device. The article transport vehicle is configured to travel along a predetermined travel path by obtaining propelling force by drivingly rotating a propelling rotatable member with the propelling rotatable member in contact with a contact portion. The propelling rotatable member can be in contact with the rotatable member transporting device. And the rotatable member transporting device transports, in an advancing direction, the propelling rotatable member in contact with the rotatable member transporting device, and is provided in place of the contact portion in a specific section included in the predetermined travel path. The propelling rotatable member is configured to be able to be drivingly rotated while in contact with the rotatable member transporting device.

10 Claims, 11 Drawing Sheets

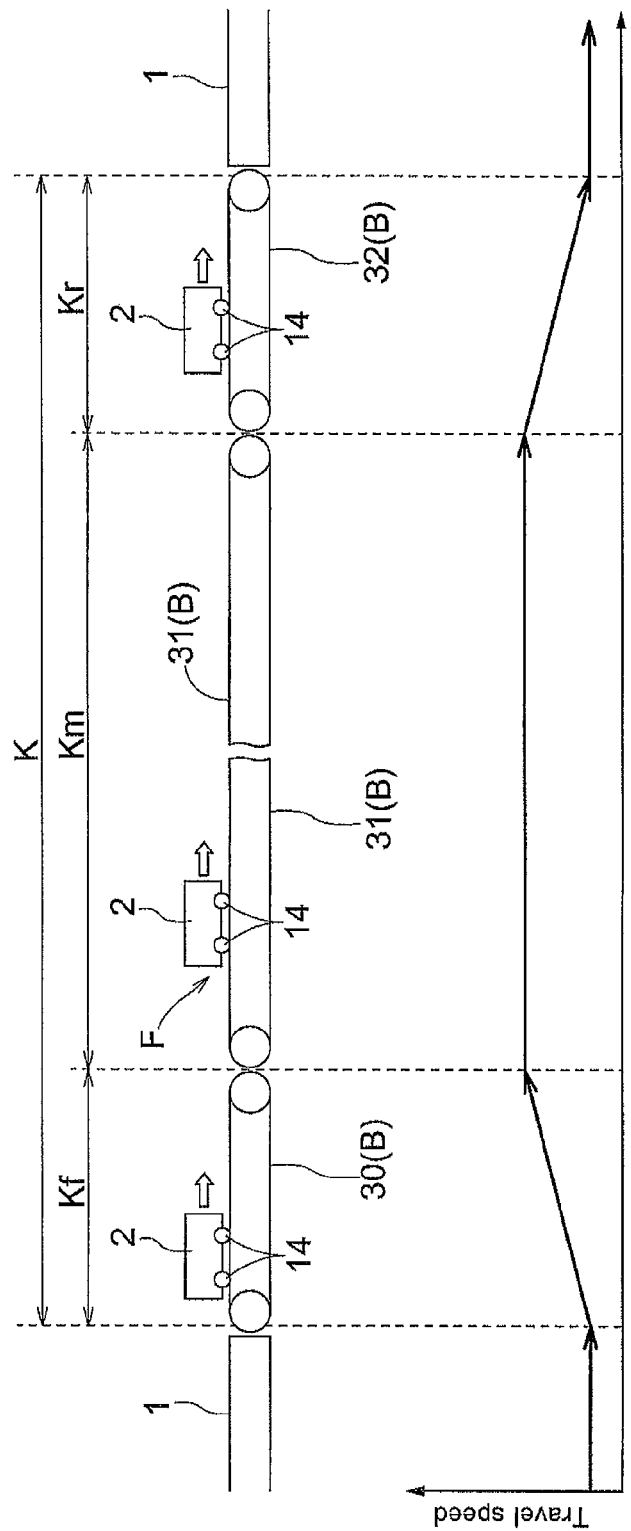

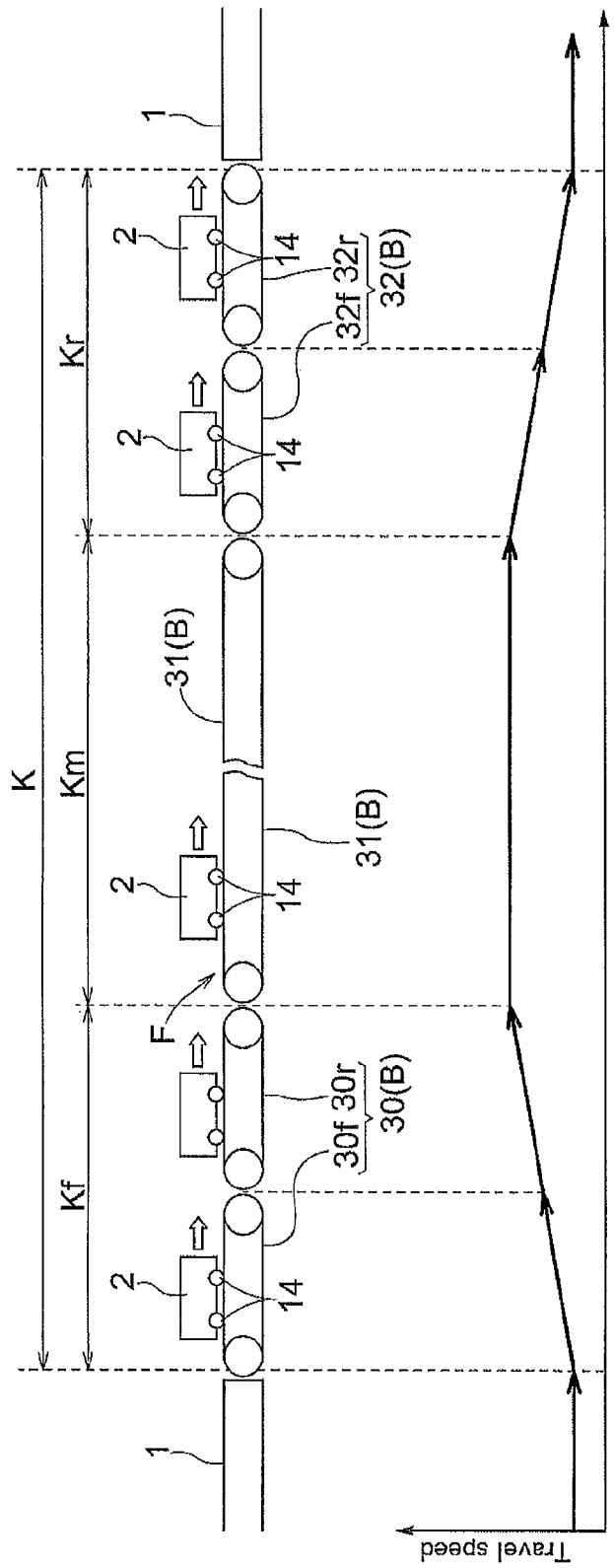

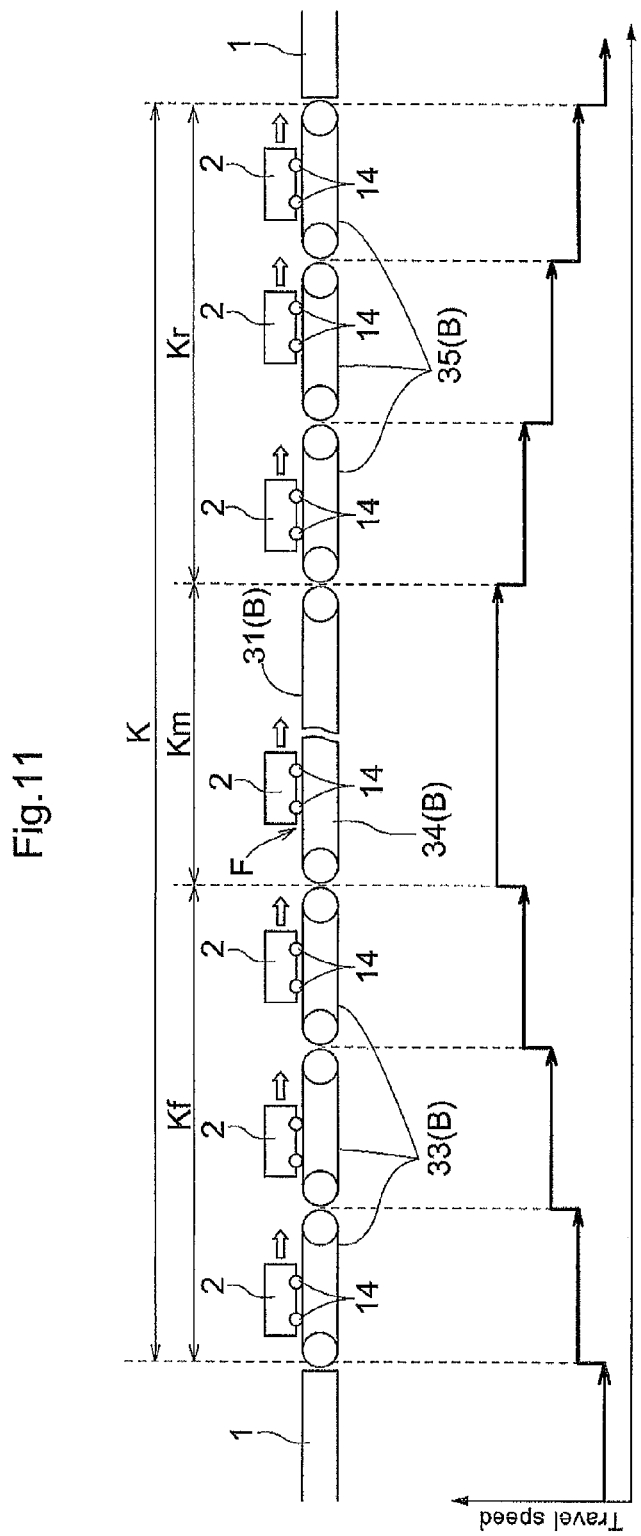

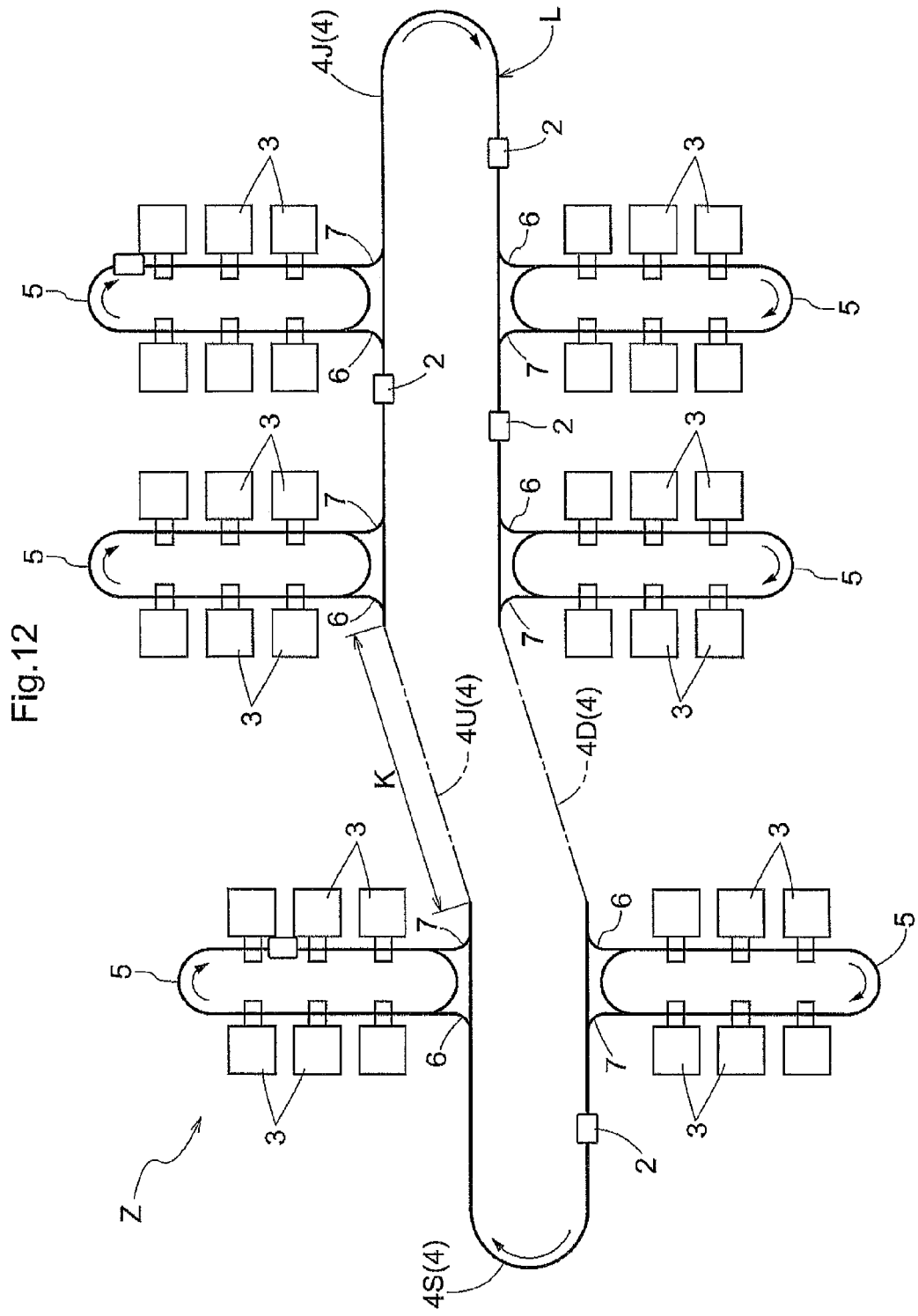

ARTICLE TRANSPORT FACILITY

FIELD OF THE INVENTION

The present invention relates to an article transport facility having an article transport vehicle configured to travel along a predetermined travel path by obtaining propelling force by drivingly rotating a propelling rotatable member with the propelling rotatable member in contact with a contact portion.

BACKGROUND

In article transport facilities such as one described above, articles are transported by traveling article transport vehicles. There are article transport vehicles that are of a hoist type that travel in the ceiling area of work space, and that are of a carriage type that travel on the floor area of the work space.

An example of an article transport facility disclosed in JP Publication of Application No. 2011-116313 (Patent Document 1) is one including an article transport vehicle of the hoist type that travels in a ceiling area of work space. In the example in Patent Document 1, the article transport vehicle travels in a ceiling area of a clean room, and transports, as an article, a container for storing substrates, such as silicon substrates.

More specifically, travel rails for the article transport vehicle are provided in the ceiling area of a clean room so as to extend along a predetermined travel path extending along, or by way of, substrate processing devices. The article transport vehicle is configured to travel along the predetermined travel path by obtaining propelling force by drivingly rotating travel wheels, which function as propelling rotatable members, with the travel wheels kept in contact with travel surfaces of the travel rails, which function as contact portions.

Incidentally, the article transport vehicle of Patent Document 1 includes an article grip portion which can be moved vertically. When transferring an article to a carry-in-and-out portion of a substrate processing device, the article transport vehicle vertically moves the article grip portion with the article transport vehicle stopped at a stop location that corresponds to the carry-in-and-out portion of the substrate processing device.

The article transport facility of Patent Document 1 is configured such that the article transport vehicle travels by means of the propelling force obtained by drivingly rotating the propelling rotatable members over the entire range of the predetermined travel path. There may be a section in the predetermined travel path in which it is desired to cause the article transport vehicle to travel faster than in other sections.

More particularly, for example, with space inside each of a plurality of operations buildings that are spaced apart from each other being defined as a work zone, the predetermined travel path may include work zone travel path portions for transporting articles within each of a plurality of work zones, and connecting travel path portions for connecting work zone travel path portions for transporting articles among the plurality of work zones. In such case, for example, the travel speed of the article transport vehicle when traveling in a connecting travel path portion is desired to be greater than the travel speed of the article transport vehicle when travelling in a work zone travel path portion. Thus, there may be a section in the predetermined travel path in which it is desired to cause the article transport vehicle to travel faster than in other sections.

The following are the reasons why the travel speed of the article transport vehicle when traveling in a connecting travel path portion is desired to be greater than the travel speed of the article transport vehicle when travelling in a work zone travel path portion. An article transport vehicle can travel continuously without stopping in a connecting travel path portion, and the connecting travel path portion can be constructed to extend straight, for example, to allow article transport vehicles to travel at higher speeds. Thus, it is desirable to cause the article transport vehicles to travel at higher speeds in such connecting travel path portions in order to improve article transporting efficiency.

In contrast, an article transport vehicle is stopped at a number of stop locations to transfer an article in a work zone travel path portion. And work zone travel path portions are installed with curved path portions in many cases, making it difficult to cause the article transport vehicle to travel at higher speeds. For these reasons, the travel speed of the article transport vehicle when travelling in a work zone travel path portion is not required to be greater than the travel speed of the article transport vehicle when traveling in a connecting travel path portion.

In order to satisfy such requirement, an article transport vehicle may be provided with a large high-output electric motor that drivingly rotates propelling rotatable members at higher speeds so that the article transport vehicle can travel at sufficiently higher speeds by means of the propelling force obtained by drivingly rotating the propelling rotatable members with the large motor. In this case, however, because the article transport vehicle is provided with a large and expensive electric motor, there is a disadvantage that the entire facility becomes expensive, which makes this a difficult option to implement.

More specifically, an article transport facility commonly has many article transport vehicles. And the entire facility becomes expensive if each of the many article transport vehicles is equipped with such an expensive electric motor.

If the article transport vehicle is of the hoist type where the article transport vehicle travels in the ceiling portion, and if the weight of the article transport vehicle is increased by the provision of a large electric motor, then the travel rails for the article transport vehicle need to be configured to have sufficient strength that would withstand the large weight which is the sum total of the weight of the article transport vehicle whose weight has increased as the result of providing it with the large electric motor, and the weight of the article transported by the article transport vehicle. Thus, there is also a disadvantage that the entire facility becomes expensive as the result of the increased installation cost of the travel rails.

Incidentally, there may be a section in the predetermined travel path in which it is desired to cause the article transport vehicle to travel faster than in other sections in an existing article transport facility as well, in order to improve article transporting efficiency. In such cases, it is difficult in practice to convert existing article transport vehicles so that they can travel at higher speeds. Thus, it may be impossible to cause the article transport vehicle to travel at higher speeds in existing article transport facilities.

SUMMARY OF THE INVENTION

In light of the state of the art described above, an article transport facility is desired in which an article transport vehicle can be caused to travel at higher speeds in sections in which it is desired to cause the article transport vehicle to travel at higher speeds in the predetermined travel path while avoiding the entire facility to become expensive.

An article transport facility in accordance with the present invention comprises:

an article transport vehicle configured to travel along a predetermined travel path by obtaining propelling force by drivingly rotating a propelling rotatable member with the propelling rotatable member in contact with a contact portion;

a rotatable member transporting device which the propelling rotatable member can be in contact with and which transports, in an advancing direction, the propelling rotatable member that is in contact with the rotatable member transporting device, the rotatable member transporting device being provided in place of the contact portion in a specific section included in the predetermined travel path;

wherein the propelling rotatable member is configured to be able to be drivingly rotated while in contact with the rotatable member transporting device.

That is, in sections other than the specific section in the predetermined path, the article transport vehicle travels along the predetermined travel path by means of the propelling force obtained by drivingly rotating the propelling rotatable member while in contact with the contact portion.

And in the specific section included in the predetermined travel path, the article transport vehicle travels at higher speeds along the predetermined travel path by means of both the propelling force obtained by drivingly rotating the propelling rotatable member while in contact with the rotatable member transporting device and the transporting force by which the rotatable member transporting device transports the propelling rotatable member in the advancing direction.

The article transport vehicle is thus caused to travel at higher speeds in the specific section included in the predetermined travel path by providing the rotatable member transporting device in place of the contact portion. Thus, the article transport vehicle can be caused to travel at higher speeds in the specific section included in the predetermined travel path while avoiding the entire facility to become expensive because of lower requirement to configure each article transport vehicle itself to travel at higher speeds.

Note that providing a rotatable member transporting device in place of a contact portion in a specific section included in the predetermined travel path can also be done in an existing transport facility. Accordingly, in an existing article transport facility in which there are sections in the predetermined travel path in which it is desired to cause the article transport vehicle to travel at higher speeds to improve article transporting efficiency, it is possible to cause the article transport vehicle to travel at higher speeds by providing these sections with the rotatable member transporting device.

As such, with the arrangement described above, an article transport facility can be provided in which an article transport vehicle can be caused to travel at higher speeds in sections in which it is desired to cause the article transport vehicle to travel at higher speeds in the predetermined travel path while avoiding the entire facility to become expensive.

Examples of preferable embodiments of the present invention are described next.

In an embodiment of the article transport facility in accordance with the present invention, the propelling rotatable member is preferably a travel wheel that is drivingly rotated with the travel wheel in contact with a travel surface which functions as the contact portion, wherein the rotatable member transporting device is preferably configured to support the travel wheel and transport the travel wheel in the advancing direction.

That is, in sections other than the specific section in the predetermined path, the article transport vehicle travels along the predetermined travel path by means of the propelling force obtained by drivingly rotating the travel wheel, which functions as the propelling rotatable member, with the travel wheel in contact with the travel surface.

And in the specific section included in the predetermined travel path, the article transport vehicle travels at higher speeds along the predetermined travel path by means of both the propelling force obtained by drivingly rotating the travel wheel with the travel wheel in contact with the rotatable member transporting device and the transporting force by which the rotatable member transporting device supports and transports the travel wheel in the advancing direction.

Thus, the article transport vehicle having the travel wheel which is drivingly rotated can be caused to travel at higher speeds in the specific section included in the predetermined travel path by providing the rotatable member transporting device which supports and transports the travel wheel in place of the travel surface.

In an embodiment of the article transport facility in accordance with the present invention, the rotatable member transporting device preferably includes and utilizes a transporting belt having a supporting and transporting surface for supporting the travel wheel and transporting the travel wheel in the advancing direction.

That is, the article transport vehicle travels at higher speed in the specific section included in the predetermined travel path by means of both the propelling force obtained by drivingly rotating the travel wheel, which functions as a propelling rotatable member, with the travel wheel in contact with the supporting and transporting surface of the transporting belt and the transporting force by which the travel wheel is transported by the transporting belt.

And since the supporting and transporting surface of the transporting belt can be formed to be a flat surface, vertical vibration of the travel wheel that travels on the supporting and transporting surface can be reduced; thus, the article transport vehicle can travel smoothly with little vertical vibration.

In other words, it is conceivable to use a roller conveyor, for example, for the rotatable member transporting device for supporting and transporting the travel wheel in the advancing direction. In this case, since unevenness exists in the top surface of the roller conveyor, the travel wheel that travels on the top surface of the roller conveyor would vibrate vertically; thus, there is a disadvantage that the article transport vehicle would vibrate vertically. In contrast, with the arrangement described above, the supporting and transporting surface of the transporting belt can be formed to be a flat surface; thus, the article transport vehicle can travel smoothly with little vertical vibration.

In an embodiment of the article transport facility in accordance with the present invention, the rotatable member transporting device is preferably configured to gradually increase a transport speed, at which the propelling rotatable member is transported, in an entrance side portion of the specific section, to maintain the transport speed in an intermediate portion located between the entrance side portion and an exit side portion of the specific section, and to gradually decrease the transport speed in the exit side portion.

That is, the propelling rotatable member of the article transport vehicle is transported such that its transport speed is gradually increased in the entrance side portion of the specific section, is maintained in the intermediate portion, and is gradually decreased in the exit side portion.

As such, since the propelling rotatable member of the article transport vehicle can be transported such that its transport speed is gradually increased in the entrance side portion of the specific section, vibration, in the fore and aft direction, experienced by the article transport vehicle entering the specific section can be reduced.

In other words, if the propelling rotatable member of the article transport vehicle is transported in the entrance side portion at a higher speed immediately after entering the specific section, the travel speed of the article transport vehicle would be increased suddenly which may result in the article transport vehicle experiencing vibration in the fore and aft direction. In contrast, with the arrangement described above, the travel speed of the article transport vehicle is gradually increased by gradually increasing the transport speed of the propelling rotatable member, in the entrance side portion of the specific section; thus, vibration, in the fore and aft direction, experienced by an article transport vehicle can be reduced.

In addition, since the propelling rotatable member of the article transport vehicle can be transported such that its transport speed is gradually decreased in the exit side portion of the specific section, vibration, in the fore and aft direction, experienced by the article transport vehicle leaving the specific section can be reduced.

More specifically, if the article transport vehicle that has been travelling in the intermediate portion of the specific section at higher speed is allowed to leave the specific section at the higher speed, the article transport vehicle may experience vibration in the fore and aft direction. In contrast, with the arrangement described above, the article transport vehicle can be allowed to leave the specific section after decreasing the travel speed of the article transport by gradually decreasing the transport speed of the propelling rotatable member, in the exit side portion of the specific section; thus, vibration, in the fore and aft direction, experienced by an article transport vehicle can be reduced.

In an embodiment of the article transport facility in accordance with the present invention, the rotatable member transporting device preferably includes a plurality of entrance side transporting members located one behind another in an transporting direction in the entrance side portion, an intermediate transporting member located in the intermediate portion, and a plurality of exit side transporting members located one behind another in the transporting direction in the exit side portion, wherein the transport speed of each of the plurality of entrance side transporting members is preferably set such that the transport speed of a given entrance side transporting member is less than the transport speed of another entrance side transporting member that is located immediately downstream of the given entrance side transporting member in the transporting direction, wherein the transport speed of the intermediate transporting member is preferably set at a predetermined high speed, and wherein the transport speed of each of the plurality of exit side transporting members is preferably set such that the transport speed of a given exit side transporting member is greater than the transport speed of another exit side transporting member that is located immediately downstream of the given exit side transporting member in the transporting direction.

That is, in the entrance side portion of a specific section, the propelling rotatable member of the article transport vehicle is first transported by the entrance side transporting member whose transport speed is the lowest among the plurality of entrance side transporting members, and is subsequently transported by an entrance side transporting member whose transport speed is greater than the first entrance side transporting member whereby the transport speed of the propelling rotatable member is gradually increased.

And in the exit side portion of a specific section, the propelling rotatable member of the article transport vehicle is first transported by the exit side transporting member whose transport speed is the highest among the plurality of exit side transporting members, and is subsequently transported by an exit side transporting member whose transport speed is less than the first exit side transporting member whereby the transport speed of the propelling rotatable member is gradually decreased.

As such, in the entrance side portion of the specific section, the transport speed of the propelling rotatable member is gradually increased by providing and arranging the plurality of entrance side transporting members one behind another in the transporting direction in the entrance side portion such that the closer the entrance side transporting member is to the entrance of the specific section, the lower its transport speed is set; thus, the transport speed of the propelling rotatable member can be gradually increased by a simple structure in which the plurality of entrance side transporting members whose transport speeds are different from one another are located one behind another in the transporting direction.

In addition, in the exit side portion of the specific section, the transport speed of the propelling rotatable member is gradually decreased by providing and arranging the plurality of exit side transporting members one behind another in the transporting direction in the exit side portion such that the closer the exit side transporting member is to the exit of the specific section, the lower its transport speed is set; thus, the transport speed of the propelling rotatable member can be gradually decreased by a simple structure in which the plurality of exit side transporting members whose transport speeds are different from one another are located one behind another in the transporting direction.

In an embodiment of the article transport facility in accordance with the present invention, the rotatable member transporting device preferably includes an entrance side transporting member located in the entrance side portion, an intermediate transporting member located in the intermediate portion, and an exit side transporting member located in the exit side portion, wherein the entrance side transporting member is preferably configured to gradually increase the transport speed when the article transport vehicle enters the entrance side transporting member, wherein the transport speed of the intermediate transporting member is preferably set at a predetermined high speed, and wherein the exit side transporting member is preferably configured to gradually decrease the transport speed when the article transport vehicle enters the exit side transporting member.

That is, the transport speed of the propelling rotatable member of the article transport vehicle is gradually increased by virtue of the fact that the transport speed of the entrance side transporting member is gradually increased when the article transport vehicle enters the entrance side portion of the specific section.

And the transport speed of the propelling rotatable member of the article transport vehicle is gradually decreased by virtue of the fact that the transport speed of the exit side transporting member is gradually decreased when the article transport vehicle enters the exit side portion of the specific section.

In addition, the predetermined high speed which is the transport speed of the transporting member maintained by the intermediate transporting member is preferably equal to the upper limit of the adjustable range of the transport speed of the entrance side transporting member, but may be set to be slightly greater than the upper limit Similarly, the upper limit of the adjustable range of the transport speed of the exit side transporting member is preferably equal to the predetermined high speed which is the transport speed of the transporting member transported by the intermediate transporting member, but may be set to be slightly less than the predetermined high speed.

As such, in the entrance side portion of the specific section, the transport speed of the propelling rotatable member of the article transport vehicle is gradually increased by gradually increasing the transport speed of the entrance side transporting member; thus, vibration, in the fore and aft direction, experienced by an article transport vehicle traveling in the entrance side portion of the specific section can be reduced to the extent possible.

Also, in the exit side portion of the specific section, the transport speed of the propelling rotatable member of the article transport vehicle is gradually decreased by gradually decreasing the transport speed of the exit side transporting member; thus, vibration, in the fore and aft direction, experienced by an article transport vehicle traveling in the exit side portion of the specific section can be reduced to the extent possible.

Incidentally, by arranging the transport speed of the entrance side transporting member to be returned to the lower limit of the adjustable range of the transport speed of the entrance side transporting member after a first article transport vehicle has left the entrance side portion of the specific section, a second article transport vehicle can be allowed to enter the entrance side portion successively when the first article transport vehicle leaves the entrance side portion. In this case, the transport speed of the exit side transporting member is returned to the upper limit of the adjustable range of the transport speed of the exit side transporting member after an article transport vehicle has left the exit side portion of the specific section.

In an embodiment of the article transport facility in accordance with the present invention, the entrance side transporting member preferably includes a plurality of entrance side transport portions located one behind another in an transporting direction, wherein each of the plurality of entrance side transport portions is preferably configured to be able to change the transport speed between a predetermined initial low speed and a predetermined final high speed wherein the predetermined final high speed of each of the plurality of entrance side transport portions is set such that the predetermined final high speed of a given entrance side transport portion is set to be equal to the predetermined initial low speed of another entrance side transport portion that is located immediately downstream of the given entrance side transport portion in the transporting direction, wherein each of the plurality of entrance side transport portions is preferably configured to gradually increase the transport speed from the predetermined initial low speed set for the entrance side transport portion toward the predetermined final high speed set for the entrance side transport portion when the article transport vehicle enters the entrance side transport portion, and to decrease the transport speed to the predetermined initial low speed when the article transport vehicle leaves the entrance side transport portion, wherein the exit side transporting member preferably includes a plurality of exit side transport portions located one behind another in the transporting direction, wherein each of the plurality of exit side transport portions is preferably configured to be able to change the transport speed between a predetermined initial high speed and a predetermined final low speed wherein the predetermined final low speed of each of the plurality of exit side transport portions is set such that the predetermined final low speed of a given exit side transport portion is set to be equal to the predetermined initial high speed of another exit side transport portion that is located immediately downstream of the given exit side transport portion in the transporting direction, and wherein each of the plurality of exit side transport portions is preferably configured to gradually decrease the transport speed from the predetermined initial high speed set for the exit side transport portion toward the predetermined final low speed set for the exit side transport portion when the article transport vehicle enters the exit side transport portion, and to increase the transport speed to the predetermined initial high speed when the article transport vehicle leaves the exit side transport portion.

That is, because the plurality of entrance side transport portions are located one behind another in the transporting direction in the entrance side portion of the specific section, the article transport vehicle enters and exits the plurality of entrance side transport portions one after another from the upstream side toward the downstream side in the transporting direction.

And each of the plurality of entrance side transport portions gradually increases the transport speed from the predetermined initial low speed set for the entrance side transport portion toward the predetermined final high speed set for the entrance side transport portion when the article transport vehicle enters the entrance side transport portion, and decreases the transport speed to the predetermined initial low speed when the article transport vehicle leaves the entrance side transport portion.

The transport speed of each of the plurality of entrance side transport portions is set such that the relationship between the transport speeds of the entrance side transport portions that are next to each other in the transporting direction is that the predetermined final high speed of the entrance side transport portion on the upstream side in the transporting direction is equal to the predetermined initial low speed of the entrance side transport portion on the downstream side in the transporting direction. Thus, as the article transport vehicle enters and leaves the plurality of entrance side transport portions one behind another, the transport speed of the propelling rotatable member is increased without being suddenly increased during the transporting process.

In addition, because the plurality of exit side transport portions are located one behind another in the transporting direction in the exit side portion of the specific section, the article transport vehicle enters and exits the plurality of exit side transport portions one after another from the upstream side toward the downstream side in the transporting direction.

And each of the plurality of exit side transport portions gradually decreases the transport speed from the predetermined initial high speed set for the exit side transport portion toward the predetermined final low speed set for the exit side transport portion when the article transport vehicle enters the exit side transport portion, and increases the transport speed to the predetermined initial high speed set for the exit side transport portion when the article transport vehicle leaves the exit side transport portion.

The transport speed of each of the plurality of exit side transport portions is set such that the relationship between the transport speeds of the exit side transport portions that are next to each other in the transporting direction is that the predetermined final low speed of the exit side transport portion on the upstream side in the transporting direction is equal to the predetermined initial high speed of the exit side transport portion on the downstream side in the transporting direction. Thus, as the article transport vehicle enters and leaves the plurality of exit side transport portions one behind another, the transport speed of the propelling rotatable member is decreased without being suddenly decreased during the transporting process.

Further, each of the plurality of entrance side transport portions is configured to gradually increase the transport speed from the predetermined initial low speed set for the entrance side transport portion toward the predetermined final high speed set for the entrance side transport portion when the article transport vehicle enters the entrance side transport portion, and to decrease the transport speed to the predetermined initial low speed when the article transport vehicle leaves the entrance side transport portion. Thus, for example, when a first article transport vehicle that has entered the entrance side transport portion which is located most upstream in the transporting direction among the plurality of entrance side transport portions leaves the most upstream entrance side transport portion, a second article transport vehicle can be allowed to enter the most upstream entrance side transport portion, so that two or more article transport vehicles can be located in the entrance side portion of the specific section.

In addition, each of the plurality of exit side transport portions is configured to gradually decrease the transport speed from the predetermined initial high speed set for the exit side transport portion toward the predetermined final low speed set for the exit side transport portion when the article transport vehicle enters the exit side transport portion, and to increase the transport speed to the predetermined initial high speed when the article transport vehicle leaves the exit side transport portion. Thus, for example, when a first article transport vehicle that has entered the exit side transport portion which is located most upstream in the transporting direction among the plurality of exit side transport portions leaves the most upstream exit side transport portion, a second article transport vehicle can be allowed to enter the most upstream exit side transport portion so that two or more article transport vehicles can be located in the exit side portion of the specific section.

In other words, with the arrangement described above, the article transporting efficiency can be improved by allowing a number of article transport vehicles to travel in the specific section of the predetermined travel path with a plurality of article transport vehicles located in the entrance side portion and the exit side portion of the specific section.

In an embodiment of the article transport facility in accordance with the present invention, the rotatable member transporting device preferably includes a transporting member that can change the transport speed of the entire transport range of the rotatable member transporting device as a unit, wherein the transporting member is preferably configured: to increase the transport speed gradually from a predetermined low speed toward a predetermined high speed when the article transport vehicle enters the entrance side portion, to maintain the transport speed at the predetermined high speed when the article transport vehicle is located in the intermediate portion, and to decrease the transport speed gradually from the predetermined high speed toward the predetermined low speed when the article transport vehicle enters the exit side portion.

That is, the transport speed of the transporting member that can change the transport speed of the entire transport range as a unit is gradually increased from the predetermined low speed toward the predetermined high speed when the article transport vehicle enters the entrance side portion, is maintained at the predetermined high speed when the article transport vehicle is located in the intermediate portion, and is gradually decreased from the predetermined high speed toward the predetermined low speed when the article transport vehicle enters the exit side portion.

Thus, by changing the transport speed of the transporting member that can change the transport speed of the entire transport range as a unit with the movement of the article transport vehicle, the transport speed is gradually increased in the entrance side portion of the specific section, is maintained in the intermediate portion, and is gradually decreased in the exit side portion of the specific section. Therefore, vibration, in the fore and aft direction, experienced by the article transport vehicle can be reduced to the extent possible with a simple structure with which the transport speed of one transporting member is changed.

In an embodiment of the article transport facility in accordance with the present invention, the predetermined travel path preferably includes a work zone travel path portion for transporting articles within each of a plurality of work zones, and a connecting travel path portion which connects the work zone travel path portions, wherein the specific section is preferably defined in the connecting travel path portion.

With the arrangement described above, the article transporting efficiency can be improved by causing the travel speed of the article transport vehicle when traveling in a connecting travel path portion to be greater than the travel speed of the article transport vehicle when travelling in a work zone travel path portion.

The following is the reason why the travel speed of the article transport vehicle when traveling in a connecting travel path portion is caused to be greater in order to improve the article transporting efficiency. That is, an article transport vehicle is stopped at a number of stop locations to transfer an article in a work zone travel path portion. And work zone travel path portions are installed with curved path portions in many cases, making it difficult to cause the article transport vehicle to travel at higher speeds. For these reasons, the article transport vehicle is not required to travel at higher speeds in a work zone travel path portion. In contrast, the article transport vehicle can travel continuously without stopping in a connecting travel path portion, and the connecting travel path portion can be constructed to extend straight, for example, to allow article transport vehicles to travel at higher speeds. Thus, the article transport vehicle is desired to travel at higher speeds in a connecting travel path portion to improve the article transporting efficiency.

In an embodiment of the article transport facility in accordance with the present invention, the predetermined travel path preferably includes an ascending path portion which is inclined to be gradually higher toward a downstream side of the path, wherein the specific section is preferably defined in the ascending path portion.

With the arrangement described above, the article transporting efficiency can be improved by avoiding the decrease in the travel speed of the article transport vehicle when traveling in the ascending path portion.

More specifically, when the predetermined travel path includes an elevated path portion and a lower path portion which is located lower than the elevated path portion, the ascending path portion which is inclined to be gradually higher toward the downstream side of the path is provided in the predetermined travel path as a path portion in which the article transport vehicle travels from the lower path portion toward the elevated path portion.

When the article transport vehicle travels in the ascending path portion only with the propelling force obtained by drivingly rotating the propelling rotatable member provided to the article transport vehicle, the travel speed decreases because of the large traveling load, which results in reduced article transporting efficiency. With the above described arrangement, by defining the ascending path portion to be the specific section, the article transporting efficiency can be improved by avoiding the decrease in the travel speed of the article transport vehicle when traveling in the ascending path portion.

BRIEF DESCRIPTION OF THE DRAWINGS

FIG. 9 shows changes in the travel speed in the specific section of the second embodiment, FIG. 10 shows changes in the travel speed in the specific section of the third embodiment, FIG. 11 shows changes in the travel speed in the specific section of the fourth embodiment, and FIG. 12 shows an alternative configuration of the predetermined travel path.

DETAILED DESCRIPTION

First Embodiment

The first embodiment of an article transport facility in accordance with the present invention is described with reference to the drawings.
(Overall Structure of the Article Transport Facility)

Figure 1:
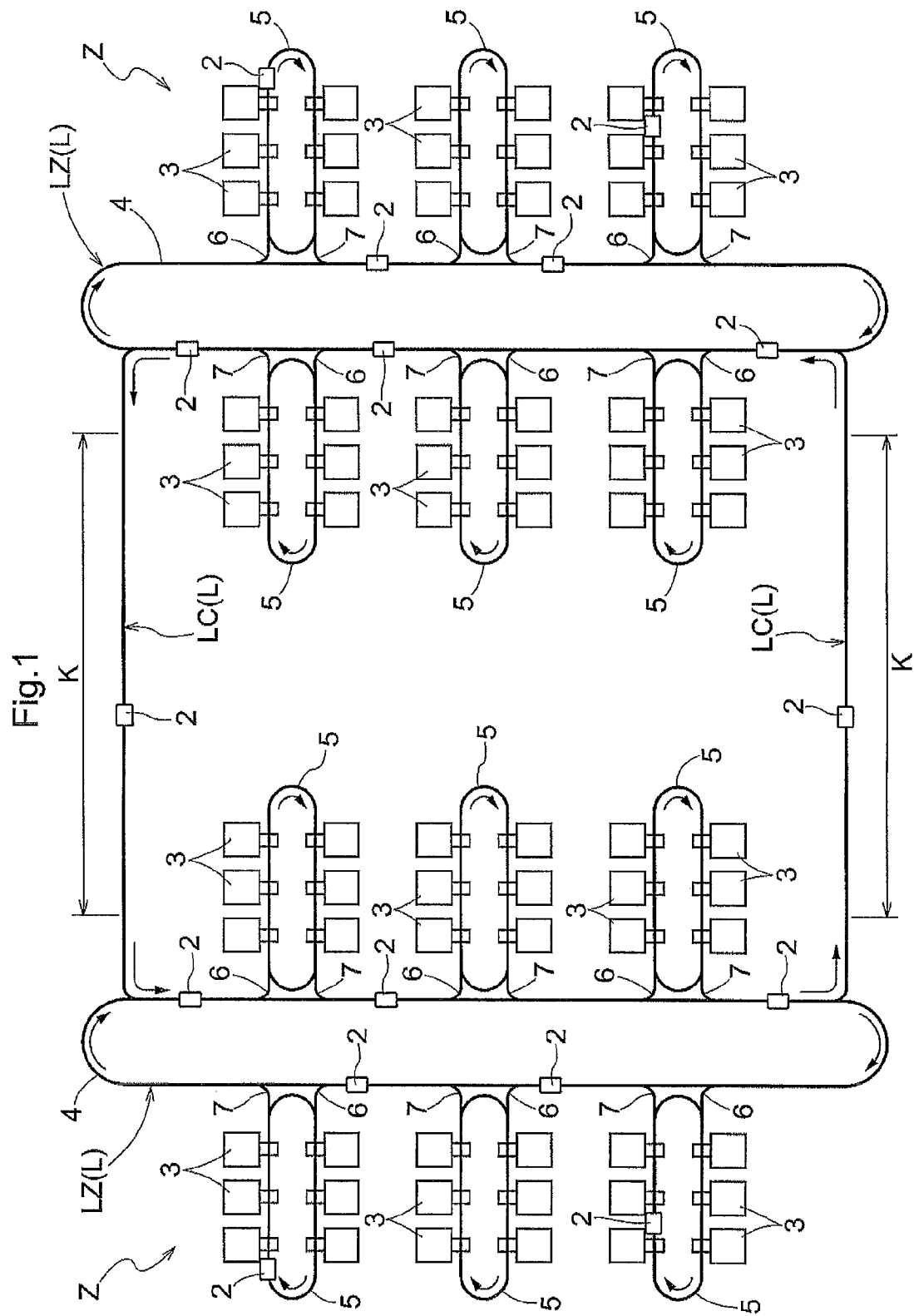
FIG. 1 is a plan view of an article transport facility of the first embodiment.
Figure 2:
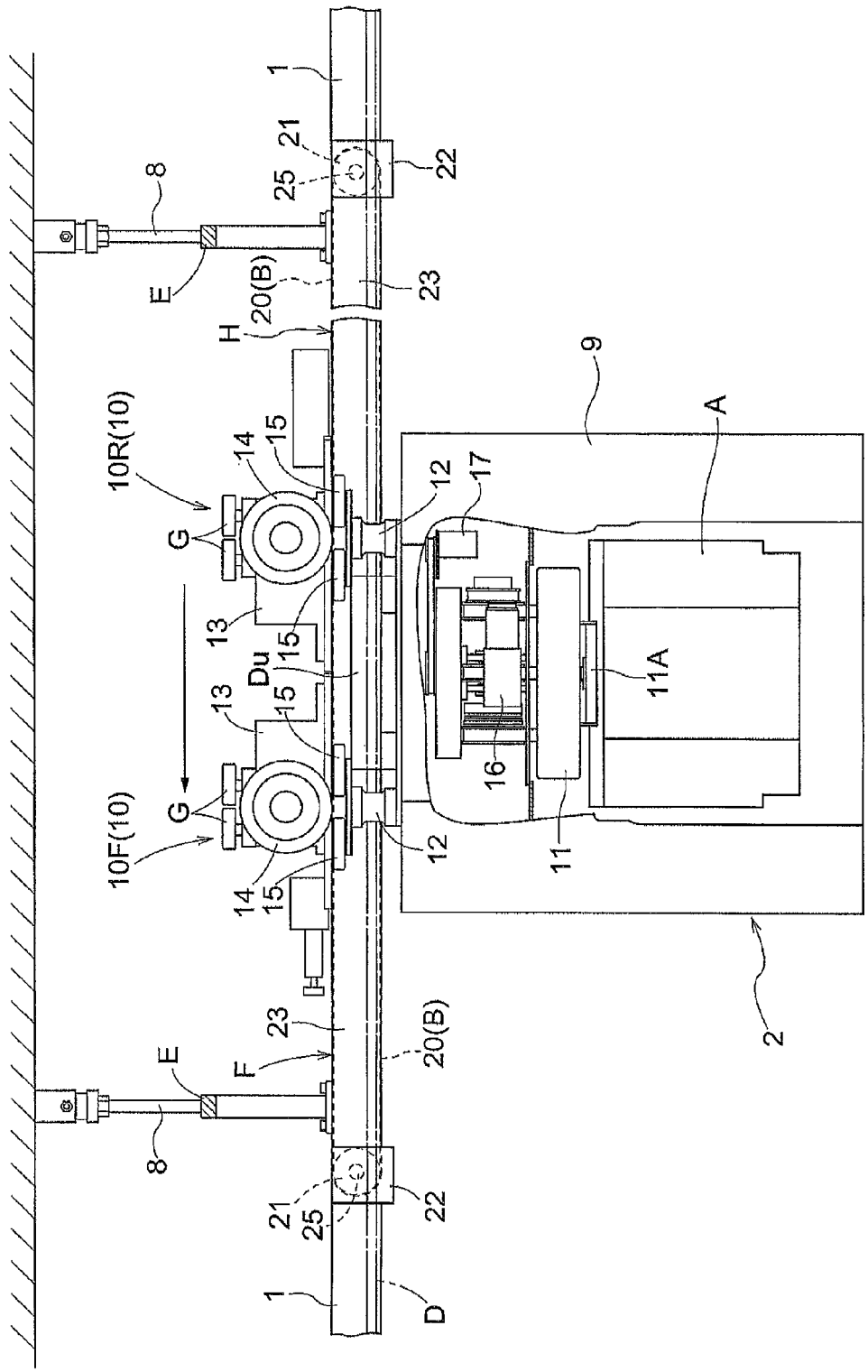
FIG. 2 is a side view of an article transport vehicle of the first embodiment shown in FIG. 1.
Figure 3:
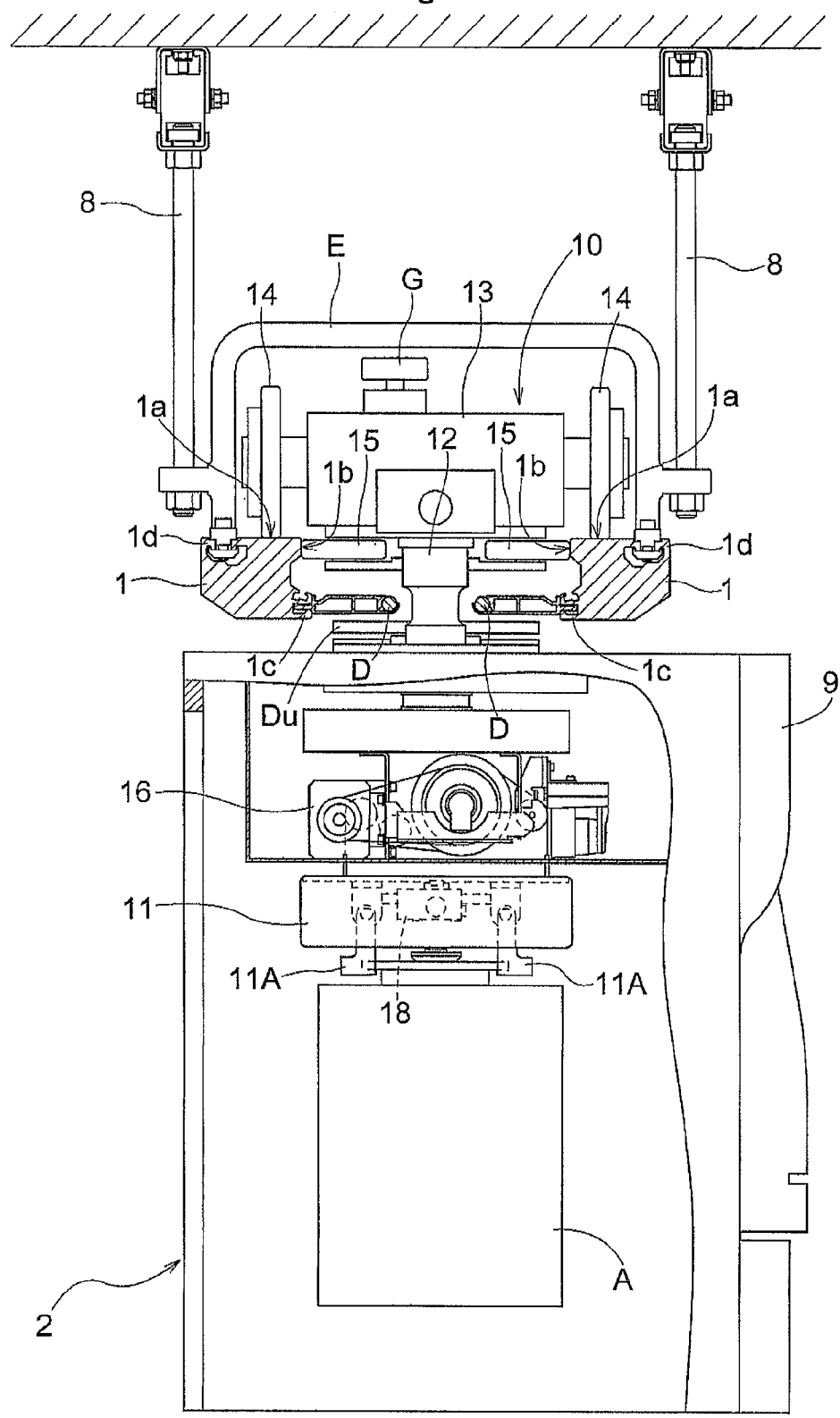
FIG. 3 is a front view of the article transport vehicle shown in FIG. 2.

As shown in FIGS. 2 and 3, a pair of right and left travel rails 1 are installed on the ceiling side of, for example, a clean room and extend along predetermined travel paths L (see FIG. 1). And hoist-type article transport vehicles 2 are provided which are configured to travel along the predetermined travel paths L while guided by the travel rails 1.

In the present embodiment, each article transport vehicle 2 is configured to transport, as an article A, a container for storing or carrying semiconductor substrates.

As shown in FIG. 1, the predetermined travel paths L are installed so as to extend along, or by way of, a plurality of article processors 3 for processing the semiconductor substrates.

In the present embodiment, a pair of work zones Z are provided as a plurality of work zones Z. And the predetermined travel paths L include work zone travel path portions LZ for transporting articles within respective work zones Z, and connecting travel path portions LC which connect these work zone travel path portions LZ.

Note that, while not shown, the two work zones Z are defined within respective separate operations buildings, each of which defines a clean room. And each connecting travel path portion LC is installed in a transport passage way that connects the two operations building. And the transport passage ways in which the connecting travel path portions LC are installed are also maintained to form a clean environment.

The work zone travel path portions LZ include main travel paths 4 each having a shape of a loop of an elongated circle, and a plurality of secondary travel paths 5 each having a shape of a loop of an elongated circle. A plurality of the secondary travel paths 5 are installed on both sides of each main travel path 4 such that these secondary travel paths are arranged and spaced apart from each other along the longitudinal direction of the main travel path 4.

And each main travel path 4 and each of the plurality of secondary travel paths 5 are connected to each other by a branching travel path 6 by means of which the article transport vehicle 2 diverges or travels away from the main travel path 4 into the secondary travel path 5, and a merging travel path 7 by means of which the article transport vehicle 2 merges into the main travel path 4 from the secondary travel path 5.

A pair of connecting travel path portions LC are provided such that each connecting travel path portion LC connects end portions of the main travel paths 4 of the pair of work zone travel path portions LZ to each other.

In the present embodiment, each of the pair of connecting travel path portions LC is formed to extend straight. And a specific section K in which the article transport vehicles 2 are caused to travel at higher speeds is defined in each of the connecting travel path portions LC. Details of the specific section K are described below. Note that the connecting travel path portions LC may be formed to curve gradually.

As shown in FIG. 1, two or more article transport vehicles 2 are provided in the present embodiment.

And each article transport vehicle 2 is configured to transport an article A received from an article processor 3 to another article processor 3 which performs another process while traveling in a fixed direction along the predetermined travel path L. Note that the travel directions of the article transport vehicles 2 are shown by the arrows in FIG. 1.

Incidentally, any given article transport vehicle 2 basically travels along a work zone travel path portion LZ installed in one of the work zones Z. The article transport vehicle 2 also travels along a connecting travel path portion LC, as needed, to move to a work zone travel path portion LZ in the other work zone Z, and to perform transport operations within the other work zone Z.

Note that, while not shown, a plurality of storage locations for storing articles A are installed in positions corresponding to the work zone travel path portions LZ, and that the article transport vehicles 2 also transport articles A received from article processors 3 to storage locations, and transport articles A received from the storage locations to the article processors 3.
(Structure of Travel Rails)

The pair of right and left travel rails 1 are so located to extend along the work zone travel path portions LZ and the connecting travel path portions LC of the predetermined travel paths L. As shown in FIG. 3, the pair of travel rails 1 are suspended from the ceiling by means of travel rail supports 8.

Figure 4:
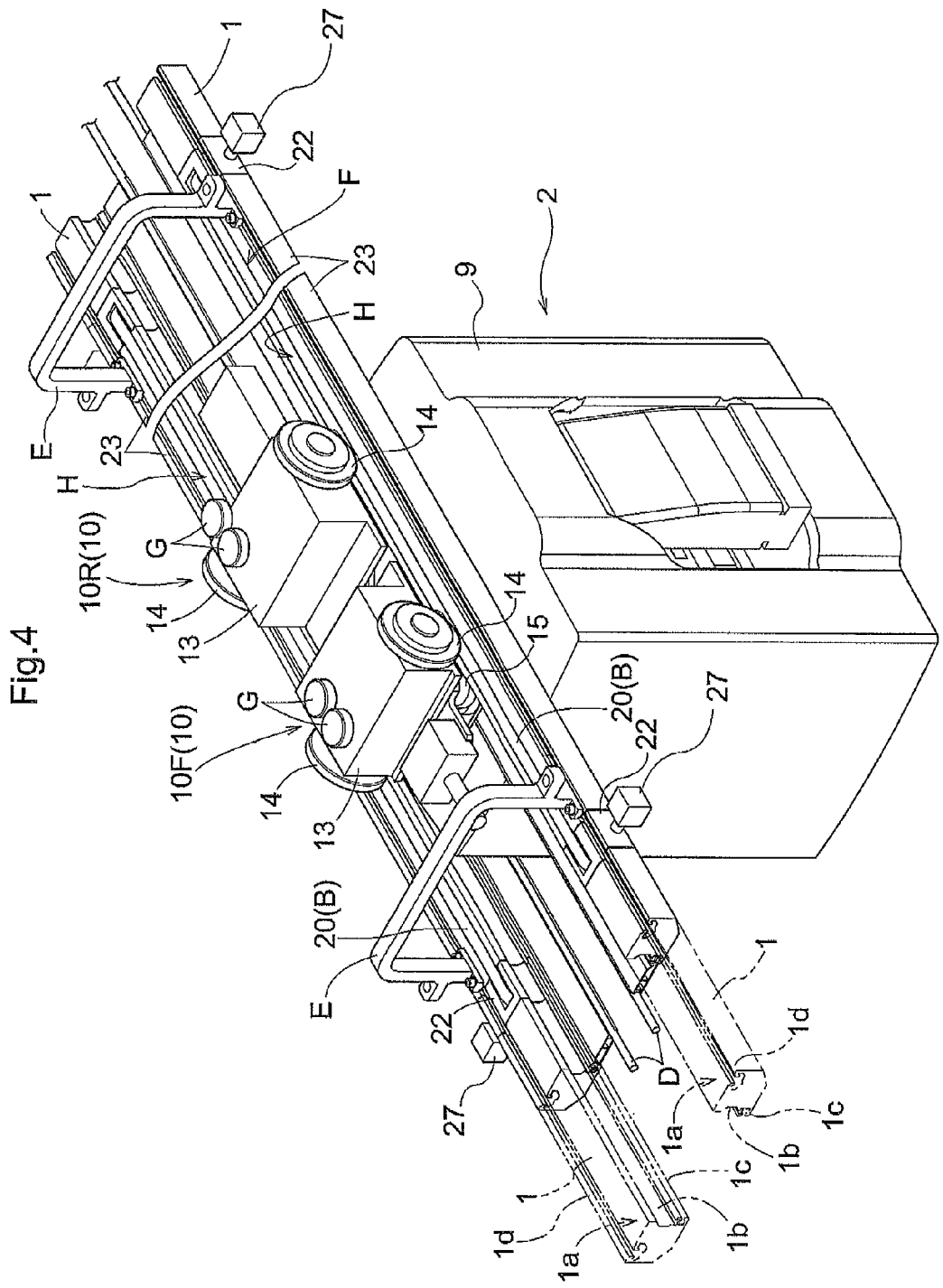
FIG. 4 is a perspective view showing a specific section in a predetermined travel path of the first embodiment.

More particularly, the pair of right and left travel rails 1 are suspended from the ceiling with the right and left travel rails 1 connected by inverted U-shaped connecting members E to form, or define, one rail body (see FIG. 4).

And each of the pair of travel rails 1 includes an upwardly facing travel surface 1a on which the travel portions 10 of the article transport vehicle 2 travel, and a laterally facing guide surface 1b which restricts the position of the article transport vehicle 2 in the lateral direction, as well as an electricity supply line support 1c which supports an electricity supply line D for supplying electric power to the article transport vehicle 2, and a connecting portion 1d for attaching the connecting member E.

Note that while a facility is described in which the travel rail supports 8 are connected to the connecting member E in the present embodiment, the facility may be implemented in which the travel rail supports 8 are attached to the connecting portions 1d.

(Structure of Article Transport Vehicle)

As shown in FIGS. 2 and 3, the article transport vehicle 2 includes a vehicle main body 9 located below the travel rails 1, and travel portions 10 that are configured to travel along the travel rails 1. The vehicle main body 9 includes a grip portion 11 for gripping and suspending an article A.

The travel portions 10 include a front travel portion 10F and a back travel portion 10R that are arranged one behind the other, or spaced apart from each other, in the fore and aft direction. And a connecting shaft 12 is provided which extends downwardly from each of the front travel portion 10F and the back travel portion 10R and which extends downwardly through space between the pair of right and left travel rails 1.

And the vehicle main body 9 is suspended from and supported by each of the front travel portion 10F and the back travel portion 10R by means of the connecting shafts 12 such that the vehicle main body 9 can be rotated with respect to each of the front travel portion 10F and the back travel portion 10R about respective axes of the connecting shafts 12.

Each of the front travel portion 10F and the back travel portion 10R has a pair of right and left travel wheels 14 that are driven and rotated by an electric motor 13 and that travel on respective travel surfaces 1a of the pair of right and left travel rails 1. In addition, each of the front travel portion 10F and the back travel portion 10R has right and left guide wheels 15 that can be rotated freely about respective axes that extend along or parallel to the vertical direction with respect to the vehicle 2 (vehicle body vertical direction) and that are in contact with respective guide surfaces 1b of the pair of right and left travel rail 1.

Note that two sets of the right and left guide wheels 15 are provided to each of the front travel portion 10F and the back travel portion 10R such that the two sets are arranged one behind the other in the fore and aft direction, i.e., with one set behind the other in the vehicle fore and aft direction.

Thus, the article transport vehicle 2 is configured to travel along the travel rails 1 by virtue of the fact that the travel wheels 14 of the front travel portion 10F and the back travel portion 10R are driven and rotated, while the position of the article transport vehicle 2 in the vehicle body lateral direction is restricted by virtue of the fact that the guide wheels 15 of the front travel portion 10F and the back travel portion 10R are guided by the pair of right and left travel rails 1.

In addition, the article transport vehicle 2 is configured to be able to travel smoothly in an arc-shaped or curved path portion, such as an arc-shaped or curved portion of the predetermined travel path L and an arc-shaped or curved portion of the secondary travel path 5 by virtue of the fact that the front travel portion 10F and the back travel portion 10R are deflected with respect to the vehicle main body 9 about respective axes of the connecting shafts 12.

Incidentally, in the present embodiment, the four travel wheels 14 function as propelling rotatable members which are drivingly rotated while in contact with the travel surfaces 1a that function as contact portions (ground side contact portions). The article transport vehicle 2 travels along the predetermined travel path L by obtaining propelling force by drivingly rotating the travel wheels 14 with the travel wheels in contact with the travel surfaces 1a.

In addition, the article transport vehicle 2 operates with the electric power supplied from the electricity supply lines D supported by respective ones of the right and left travel rails 1. A single power receiving portion Du (power receiving coil), to which electric power is supplied without contact, or contactlessly, from the right and left electricity supply lines D, is provided above the vehicle main body 9 and between the pair of front and back connecting shafts 12.

More specifically, magnetic field is generated by applying alternating currents to the electricity supply lines D. The magnetic field, in turn, causes the power receiving portion Du to generate driving electric power. Thus, the driving electric power is supplied to the article transport vehicle 2 without contact.

Note that a pair of front and back guide wheels G which are rotatable about vertical axes are provided as guided members for switching paths and at locations above the travel wheels 14 of the front travel portion 10F and the back travel portion 10R. And the article transport vehicle 2 performs a branching travel or merging travel at a branching location or a merging location in the predetermined travel paths L by changing or switching the position of guide wheel G in the vehicle body lateral direction. Since details of such operations are well known in the art, further description is omitted here.

(Structure of Grip Portion)

As shown in FIGS. 2 and 3, the vehicle main body 9 is formed in the shape of an inverted U which opens downwardly with the forward end side portion and rearward end side portion in the vehicle body fore and aft direction extending downwardly. The grip portion 11 described above is located between the forward end side portion and the rearward end side portion of the vehicle main body 9.

The vehicle main body 9 includes a vertical movement electric motor 16 for vertically moving the grip portion 11, and a turning electric motor 17 for turning the grip portion 11 about a vertical axis.

The grip portion 11 includes a pair of grippers 11A for gripping an article A such that the attitudes, or positions, of the grippers 11A can be changed between gripping attitudes in which the article A is gripped and grip release attitudes in which the grip on the article is released. In addition, the grip portion 11 includes an gripping movement electric motor 18 for changing the attitudes of the grippers 11A.

Thus, an article A is supplied to the article processor 3 or the storage location, and is received from the article processor 3 or the storage location by vertically moving the grip portion 11 and changing the attitudes of the grippers 11A (and turning the grip portion 11 as required) with the article transport vehicle 2 stopped at an article transfer location for an article processor 3 or a storage location. Since the details of these operations are well known in the art, further description is omitted here.

(Control Structure)

The article transport vehicle 2 includes a vehicle side controller (not shown) for controlling operation of the article transport vehicle 2 by controlling, among other operations, traveling operations of the front travel portion 10F and the back travel portion 10R, vertical movement operation of the grip portion 11, and attitude changing operation of the grippers 11A.

And when the vehicle side controller receives, by means of wireless communications etc., a transport command which specifies a station of transport origin, and a station of transport destination from a facility management computer which manages operations of a plurality of article transport vehicles 2, the vehicle side controller is configured to perform a transport process in which an article A is transported from the station of transport origin specified in the transport command to the station of transport destination.

Incidentally, an article processor 3 and a storage location are, or correspond to, the station of transport origin, and the station of transport destination.

More specifically, the article transport vehicle 2 has various sensors, such as a sensor for detecting a target stop position that corresponds to each station, and a sensor for detecting the travel distance of the article transport vehicle 2 from a reference point.

And the vehicle side controller is configured to control, based on the detected information from these various sensors, the traveling operations of the front travel portion 10F and the back travel portion 10R in order to travel to the specified station of transport origin and to travel from the station of transport origin to the specified station of transport destination. In addition, the vehicle side controller is configured to control, at the station of transport origin, vertical movement operation of the grip portion 11 and the attitude changing operation of the grippers 11A in order to receive an article A from the station of transport origin, and to control, at the station of transport destination, vertical movement operation of the grip portion 11 and the attitude changing operation of the grippers 11A in order to supply an article A to the station of transport destination.

(Structure of Rotatable Member Transporting Device)

In the present embodiment, as described above, a specific section K is defined in each connecting travel path portion LC of the predetermined travel paths L.

Figure 5:
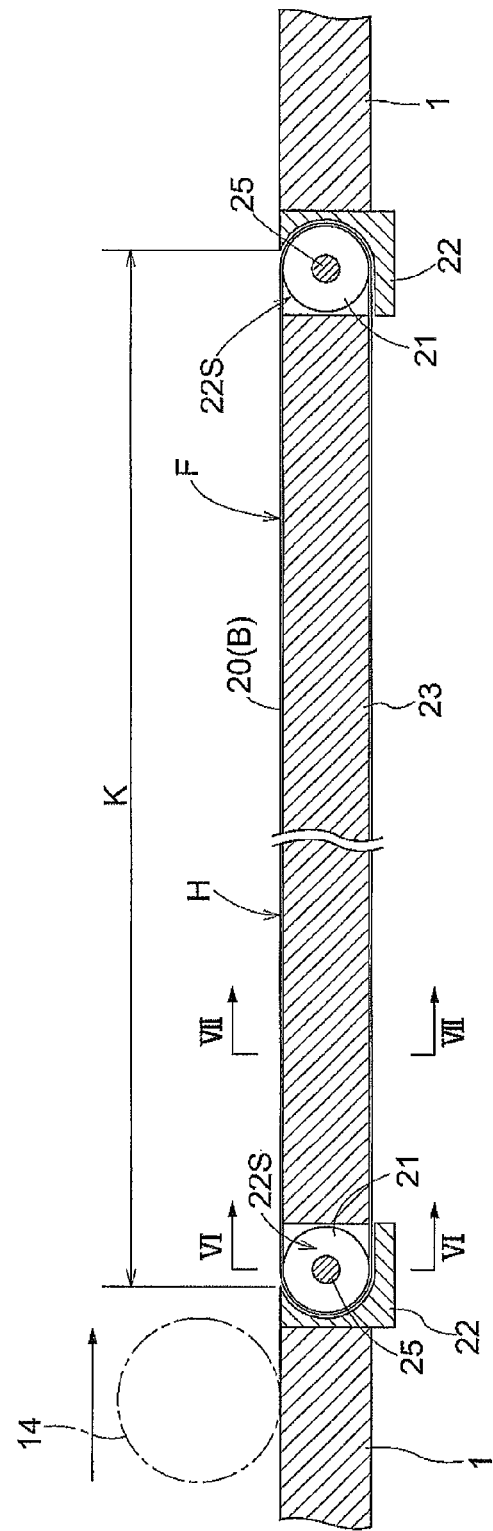
FIG. 5 is a cutout side view showing the specific section of FIG. 4.

And, as shown in FIGS. 2, 4, and 5, in each specific section K, and in place of the travel surfaces 1$a$ of the travel rails 1, a rotatable member transporting device F is provided which the travel wheels 14 can contact and which transports the travel wheels 14 in contact in an advancing direction. The travel wheels 14 are configured to be able to be driven and rotated while in contact with the rotatable member transporting device F. That is, the article transport vehicle 2 is configured to be able to obtain propelling force by drivingly rotating the travel wheels 14 with the travel wheels 14 in contact with the rotatable member transporting device F.

The rotatable member transporting device F is configured to support the travel wheels 14 and transport the travel wheels 14 in the advancing direction. More specifically, the rotatable member transporting device F includes and utilizes, on each lateral side, a transporting belt B having a supporting and transporting surface H for supporting and transporting the travel wheels 14.

That is, in the present embodiment, a single transporting belt 20 is provided as each transporting belt B. And the single transporting belt 20 is installed (on each lateral side) in, or in correspondence with, the specific section K as a transporting member which can change the transport speed of its entire transport range as a unit.

Figure 8:
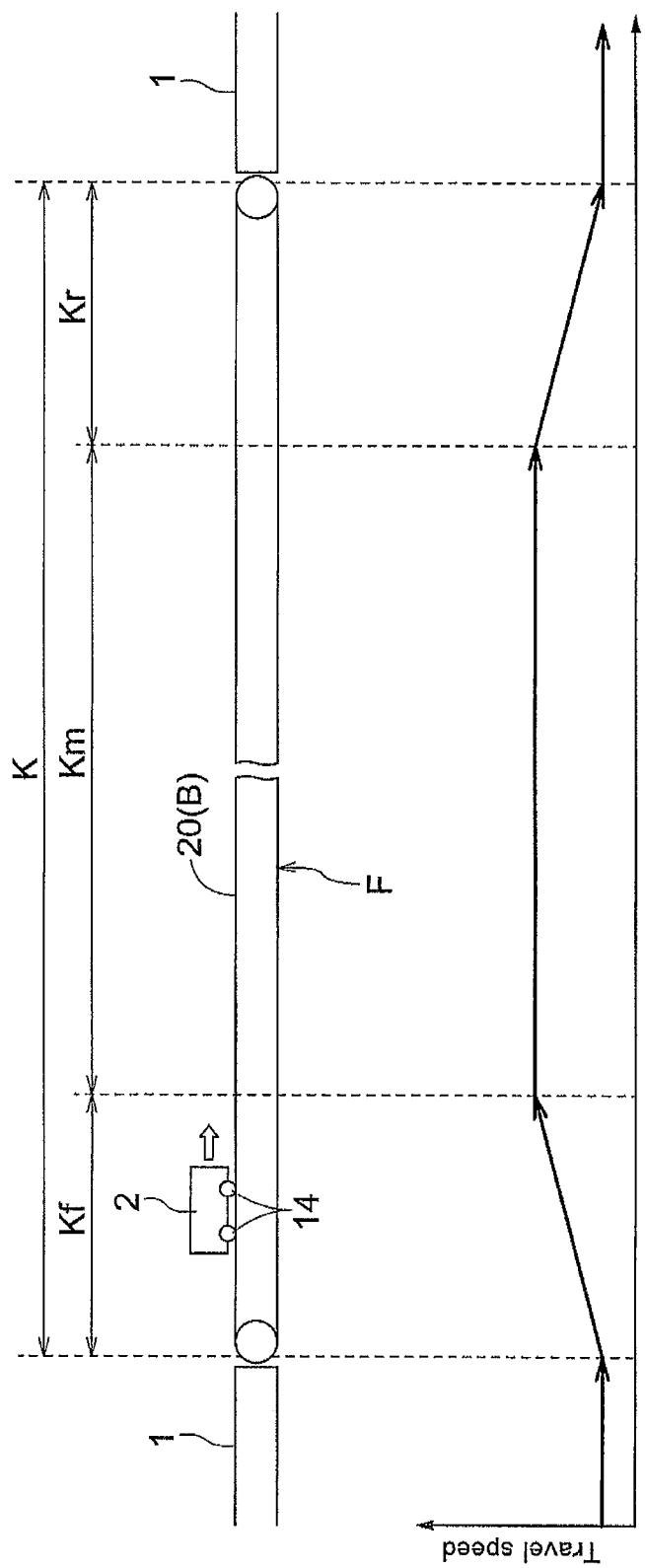
FIG. 8 shows changes in the travel speed in the specific section of the first embodiment.

In addition, as shown in FIG. 8, the rotatable member transporting device F is configured to gradually increase the transport speed of the travel wheels 14 in an entrance side portion Kf of the specific section K, to maintain the transport speed of the travel wheels 14 in a high speed state in an intermediate portion Km located between the entrance side portion Kf and an exit side portion Kr of the specific section K, and to gradually decrease the transport speed of the travel wheels 14 in the exit side portion Kr. Note that high speed state is a state in which the transport speed of the travel wheels 14 is greater than or equal to the speed achieved after the acceleration in the entrance side portion Kf.

Thus, the travel speed of the article transport vehicle 2 is gradually increased in the entrance side portion Kf of the specific section K, then is maintained in the high speed state in the intermediate portion Km between the entrance side portion Kf and the exit side portion Kr of the specific section K, and is subsequently decreased gradually in the exit side portion Kr.

More specifically, when the article transport vehicle 2 enters the entrance side portion Kf, the single transporting belt 20 gradually increases the transport speed in the entrance side portion Kf by gradually increasing the transport speed from a predetermined low speed toward a predetermined high speed. And when the article transport vehicle 2 is in the intermediate portion Km, the single transporting belt 20 maintains the transport speed in the high speed state by maintaining the transport speed at the predetermined high speed. Further, when the article transport vehicle 2 enters the exit side portion Kr, the single transporting belt 20 gradually decreases the transport speed in the exit side portion Kr by gradually decreasing the transport speed from the predetermined high speed toward the predetermined low speed.

Note that while it is preferable that the predetermined low speed is slightly greater than zero, the predetermined low speed may be set to zero.

Incidentally, it is determined that the article transport vehicle 2 has entered the entrance side portion Kf if both the front and back travel wheels 14 of the article transport vehicle 2 are located in the entrance side portion Kf. Similarly, it is determined that the article transport vehicle 2 has entered the exit side portion Kr if both the front and back travel wheels 14 of the article transport vehicle 2 are located in the exit side portion Kr.

In addition, the length of the entrance side portion Kf of the specific section K is set to a length in which the transport speed can be changed or increased from the predetermined low speed to the predetermined high speed while the article transport vehicle 2 is traveling in the entrance side portion Kf. Similarly, the length of the exit side portion Kr of the specific section K is set to a length in which the transport speed can be changed or decreased from the predetermined high speed to the predetermined low speed while the article transport vehicle 2 is traveling in the exit side portion Kr.

Therefore, in each specific section K in the predetermined travel paths L, the article transport vehicle 2 travels at higher speeds by both the propelling force obtained by drivingly rotating the travel wheels 14 while in contact with the supporting and transporting surface H of the single transporting belt 20 and the transporting force with which the travel wheels 14 are supported and transported by the single transporting belt 20.

Note that FIG. 8 shows how the travel speed of the article transport vehicle 2 is gradually increased, then maintained at the constant high speed state, and is subsequently decreased gradually.

(Arrangement of Transporting Belt)

As shown in FIGS. 4 and 5, a pulley support frame 22 for supporting a pulley 21 over which the single transporting belt 20 runs (belt circulating pulley) is provided in each end portion of the specific section K on each lateral side. And a belt guide frame 23 is located between and connected to the pulley support frames 22 on each lateral side.

Figure 7:
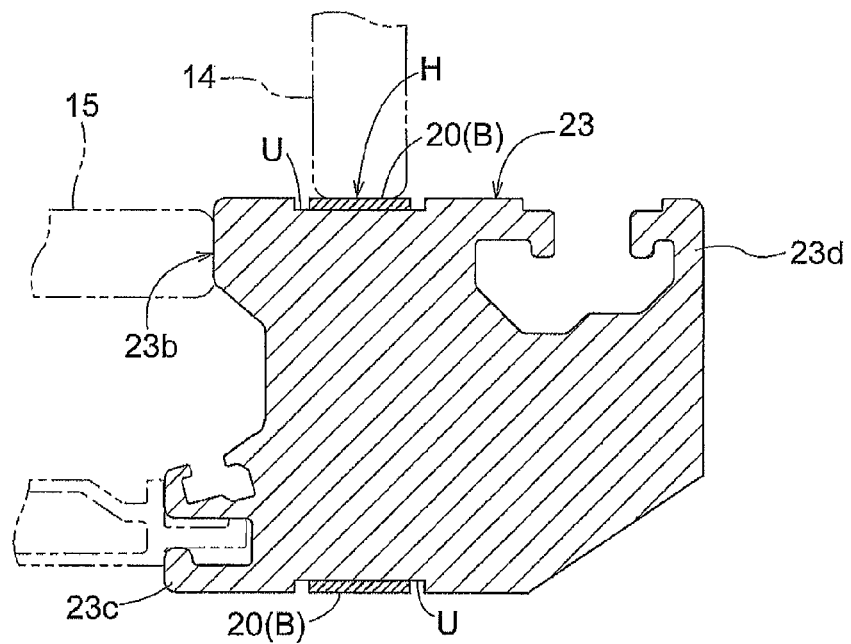
FIG. 7 is a cross sectional view taken at, and as seen in the direction shown with, VII-VII in FIG. 5.

As shown in FIG. 7, each belt guide frame 23 is basically configured similarly to the travel rail 1. The belt guide frame 23 is different from the travel rail 1 in that a belt engaging groove U is formed in the top surface portion and in the undersurface portion of the belt guide frame 23, And similarly to the travel rail 1, each belt guide frame 23 includes a guide surface 23$b$ which guides the guide wheels 15, an electric supply support 23$c$ which supports the electricity supply line D, and a connecting portion 23$d$ for the connecting member E.

Figure 6:
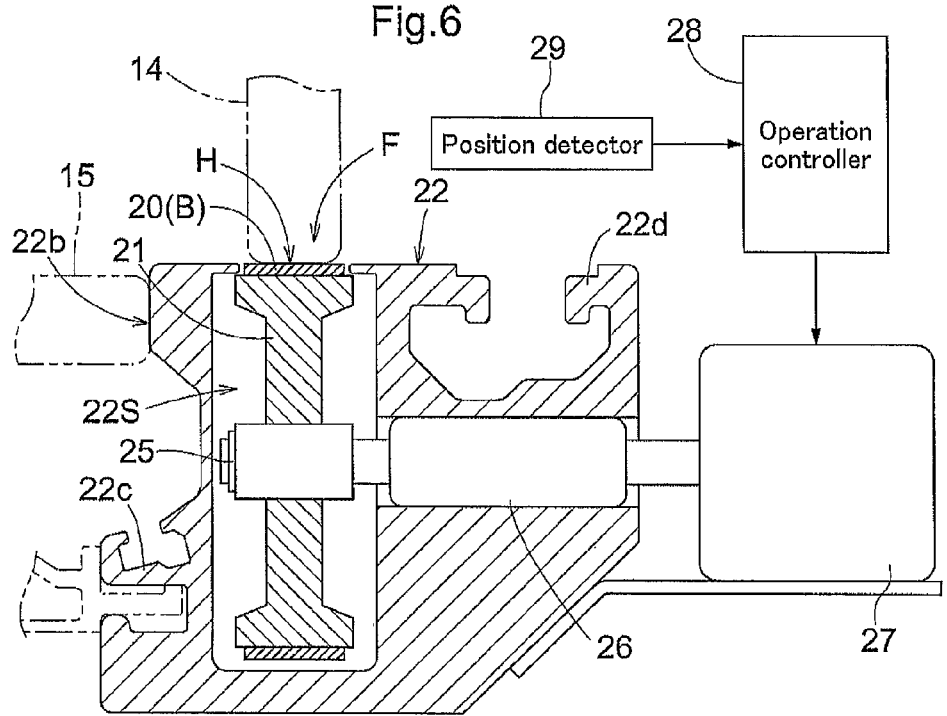
FIG. 6 is a cross sectional view taken at, and as seen in the direction shown with, VI-VI in FIG. 5.

As shown in FIG. 6, each pulley support frame 22 has a portion, located next to the belt guide frame 23, that has a U-shaped cross section to form space 22S which opens upwardly and in which the pulley 21 is located. In addition, as shown in FIG. 5, the pulley support frame 22 has a surface that is located opposite the single transporting belt 20 and that is arc-shaped to conform to the shape of the single transporting belt 20.

And similarly to the travel rail 1, each pulley support frame 22 includes a guide surface 22b which guides the guide wheels 15, an electric supply support 22c which supports the electricity supply line D, and a connecting portion 22d for the connecting member E.

A pivot shaft 25 to which a belt circulating pulley 21 is attached is rotatably supported to each pulley support frame 22 via a bearing 26. And an electric motor 27 with reduction gears for drivingly rotating the pivot shaft 25 is supported by the pulley support frame 22.

Note that, in the present embodiment, an example is described in which, on each lateral side, a belt circulating pulley 21 is installed in each pulley support frame 22 located in each end portion of the specific section K with each pulley 21 configured to be driven by the electric motor 27 with reduction gears. Alternatively, the facility may be configured such that, on each lateral side, a belt circulating pulley 21 that is configured to be driven by the electric motor 27 with reduction gears is installed in the pulley support frame 22 located in one end portion of the specific section K whereas a freely rotatable belt circulating pulley 21 is installed in the pulley support frame 22 located in the other end portion of the specific section K.

(Control Structure for Transporting Belt)

As shown in FIG. 6, an operation controller 28 for controlling the operation of the electric motor 27 with reduction gears, and a position detector 29 for detecting the position of the article transport vehicle 2 in the specific section K are provided.

And the operation controller 28 is configured to control the operation of the electric motor 27 with reduction gears in order to change the transport speed of the single transporting belt 20 based on the detected information of the position detector 29.

More specifically, the position detector 29 may be, for example, a plurality of photo-interrupter type optical sensors located at various positions in the specific section K. In this case, the position of the article transport vehicle 2 is detected when the light from a light emitting element of an optical sensor is interrupted by the article transport vehicle 2. The position detector 29 is configured to detect: that the article transport vehicle 2 has entered the entrance side portion Kf of the specific section K, that the article transport vehicle 2 has left the entrance side portion Kf of the specific section K (in other words, the article transport vehicle 2 has entered the intermediate portion Km of the specific section K), that the article transport vehicle 2 has left the intermediate portion Km of the specific section K (in other words, the article transport vehicle 2 has entered the exit side portion Kr of the specific section K), and that the article transport vehicle 2 has left the exit side portion Kr of the specific section K. And position detector 29 is also configured to output the detected information to the operation controller 28.

The operation controller 28 is configured to control the operation of the electric motor 27 with reduction gears based on the detected information from the position detector 29 in order to: cause the transport speed of the single transporting belt 20 to be gradually increased from the predetermined low speed toward the predetermined high speed when the article transport vehicle 2 enters the entrance side portion Kf; maintain the transport speed of the single transporting belt 20 at the predetermined high speed when the article transport vehicle 2 is located in the intermediate portion Km; and to cause the transport speed of the single transporting belt 20 to be gradually decreased from the predetermined high speed toward the predetermined low speed when the article transport vehicle 2 enters the exit side portion Kr.

Incidentally, in the present embodiment, since the single transporting belt 20 which functions as the transporting belt B, is installed in, or in correspondence with, the entire range of the specific section K, the operations of the plurality of the article transport vehicles 2 are controlled such that only one article transport vehicle 2 is located in the specific section K in principle.

As described above, in accordance with the present embodiment, each specific section K is provided with the rotatable member transporting device F so that article transport vehicles 2 can be caused to travel at higher speeds in each connecting travel path portion LC which connects the work zone travel path portions LZ; thus, article transporting efficiency can be improved.

Moreover, the rotatable member transporting device F transports the travel wheels 14 of the article transport vehicle 2 such that the transport speed is gradually increased in the entrance side portion Kf of the specific section K, and is gradually decreased in the exit side portion Kr of the specific section K; thus, vibration, in the fore and aft direction, experienced by the article transport vehicle 2 traveling in the specific section K can be reduced.

In addition, since the rotatable member transporting device F includes and utilizes a transporting belt B having the supporting and transporting surface H for supporting and transporting the travel wheels 14 in the advancing direction, vertical vibrations of the travel wheels 14 traveling on the supporting and transporting surface H are reduced; thus, the article transport vehicles 2 can travel smoothly with little vertical vibration.

Further, since the single transporting belt 20 is provided as the transporting belt B, the entire configuration can be simplified.

Second Embodiment

The second embodiment is described next, which has a configuration similar to that of the first embodiment except that the configuration of the rotatable member transporting device F is different from that in the first embodiment.

Therefore, only the configuration of the rotatable member transporting device F is described here in order not to duplicate the descriptions of other parts.

In the second embodiment, the rotatable member transporting device F utilizes transporting belts B for supporting and transporting the travel wheels 14 of the article transport vehicle 2 as is the case in the first embodiment; however, the configuration of the transporting belts B is different from that in the first embodiment.

More specifically, as shown in FIG. 9, the rotatable member transporting device F includes, on each lateral side: an entrance side transporting belt 30 which functions as an entrance side transporting member in the entrance side portion Kf of the specific section K; an intermediate transporting belt 31 which functions as an intermediate transporting member in the intermediate portion Km located between the entrance side portion Kf and an exit side portion Kr, and an exit side transporting belt 32 which functions as an exit side transporting member in the exit side portion Kr.

In other words, the entrance side transporting belt 30, the intermediate transporting belt 31, and the exit side transporting belt 32 are provided as the transporting belt B in the present embodiment.

The entrance side transporting belt 30 is configured to gradually increase the transport speed of the travel wheels 14 from a predetermined taking-in low speed toward the predetermined taking-out high speed when the article transport vehicle 2 enters the entrance side transporting belt 30, and to decrease its speed rapidly to the predetermined taking-in low speed when the article transport vehicle 2 leaves the entrance side transporting belt 30. This arrangement allows the transport speed of the travel wheels 14 to be gradually increased in the entrance side portion Kf. Note that the expression "decreasing the speed rapidly" means decreasing the transport speed at a greater time rate of change (for example, by a factor of about ten) than the time rate of change for when the transport speed is increased. The same is true in the following description.

Note that although it is preferable that the predetermined taking-in low speed is slightly greater than zero, it may be set to zero.

The transport speed of the travel wheels 14 in the intermediate transporting belt 31 is set to the predetermined high speed. Thus the transport speed of the travel wheels 14 is maintained at the high speed state in the intermediate portion Km located between the entrance side portion Kf and the exit side portion Kr.

Incidentally, although it is preferable that the predetermined high speed which is the transport speed of the intermediate transporting belt 31 is equal to the predetermined taking-out high speed of the entrance side transporting belt 30, the transport speed of the intermediate transporting belt 31 may be set to be slightly greater than the predetermined taking-out high speed of the entrance side transporting belt 30.

The exit side transporting belt 32 is configured to gradually decrease the transport speed of the travel wheels 14 from a predetermined taking-in high speed toward the predetermined taking-out low speed when the article transport vehicle 2 enters the exit side transporting belt 32, and to increase its speed rapidly to the predetermined taking-in high speed when the article transport vehicle 2 leaves the exit side transporting belt 32. This arrangement allows the transport speed of the travel wheels 14 to be gradually decreased in the exit side portion Kr. Note that the expression "increasing the speed rapidly" means increasing the transport speed at a greater time rate of change (for example, by a factor of about ten) than the time rate of change for when the transport speed is decreased. The same is true in the following description.

Note that although it is preferable that the predetermined taking-in high speed of the exit side transporting belt 32 is equal to the predetermined high speed of the intermediate transporting belt 31, the predetermined taking-in high speed of the exit side transporting belt 32 may be set to be slightly less than the predetermined high speed of the intermediate transporting belt 31.

Incidentally, it is determined that the article transport vehicle 2 has entered the entrance side portion Kf if both the front and back travel wheels 14 of the article transport vehicle 2 are located in the entrance side portion Kf. Similarly, it is determined that the article transport vehicle 2 has entered the exit side portion Kr if both the front and back travel wheels 14 of the article transport vehicle 2 are located in the exit side portion Kr. In addition, it is determined that the article transport vehicle 2 has left the entrance side portion Kf if both the front and back travel wheels 14 of the article transport vehicle 2 have left the entrance side portion Kf. Similarly, it is determined that the article transport vehicle 2 has left the exit side portion Kr if both the front and back travel wheels 14 of the article transport vehicle 2 have left the exit side portion Kr.

In addition, the length of the entrance side portion Kf of the specific section K is set to a length in which the transport speed can be changed or increased from the predetermined taking-in low speed to the predetermined taking-out high speed while the article transport vehicle 2 is traveling in the entrance side portion Kf. Similarly, the length of the exit side portion Kr of the specific section K is set to a length in which the transport speed can be changed or decreased from the predetermined taking-in high speed to the predetermined taking-out low speed while the article transport vehicle 2 is traveling in the exit side portion Kr.

With regard to controlling the operations of the entrance side transporting belt 30 and the exit side transporting belt 32, an operation controller which is identical or similar to the operation controller 28 for the transporting belt B of the first embodiment is provided, with the operation controller controlling operations of the electric motors which individually drive the entrance side transporting belt 30 and the exit side transporting belt 32 based on the detected information from the position detector 29.

In short, in the second embodiment, by providing the entrance side transporting belt 30, the intermediate transporting belt 31, and the exit side transporting belt 32 on each lateral side, the rotatable member transporting device F is configured: to gradually increase the transport speed of the travel wheels 14 in the entrance side portion Kf when the article transport vehicle 2 enters the entrance side portion Kf of the specific section K; to maintain the transport speed of the travel wheel 14 at the high speed state in the intermediate portion Km located between the entrance side portion Kf and the exit side portion Kr; and to gradually decrease the transport speed of the travel wheels 14 in the exit side portion Kr when the article transport vehicle 2 enters the exit side portion Kr of the specific section K.

Note that FIG. 9 shows how the travel speed of the article transport vehicle 2 is gradually increased, then maintained at the constant high speed state, and is subsequently decreased gradually.

As described above, in the second embodiment, each specific section K is provided with the rotatable member transporting device F so that article transport vehicles 2 can be caused to travel at higher speeds in each connecting travel path portion LC which connects the work zone travel path portions LZ; thus, article transporting efficiency can be improved as is the case with the first embodiment.

Moreover, the rotatable member transporting device F transports the travel wheels 14 of the article transport vehicle 2 such that the transport speed is gradually increased in the entrance side portion Kf of the specific section K and such that the transport speed is gradually decreased in the exit side portion Kr of the specific section K; thus, vibration, in the fore and aft direction, experienced by the article transport vehicle 2 traveling in the specific section K can be reduced.

And since transporting belts B utilized in the rotatable member transporting device F have the supporting and transporting surfaces H, the article transport vehicles 2 can travel smoothly with little vertical vibration.

Further, in the second embodiment, the transporting belt B is divided into the entrance side transporting belt 30, the intermediate transporting belt 31, and the exit side transporting belt 32. And the speed of the entrance side transporting belt 30 is decreased rapidly to the predetermined taking-in low speed when the article transport vehicle 2 leaves the entrance side transporting belt 30. And the speed of the exit side transporting belt 32 is increased rapidly to the predetermined taking-in high speed when the article transport vehicle 2 leaves the exit side transporting belt 32. Thus, for example, as shown in FIG. 9, two or more article transport vehicles 2 can be located simultaneously in the specific section K by allowing a second article transport vehicle 2 to enter the entrance side portion Kf of the specific section K after a first article transport vehicle 2 that entered the entrance side portion Kf earlier has left the entrance side portion Kf.

Third Embodiment

The third embodiment is described next, which has a configuration similar to that of the first embodiment except that the configuration of the rotatable member transporting device F is different from that in the first embodiment.

Therefore, only the configuration of the rotatable member transporting device F is described here in order not to duplicate the descriptions of other parts.

In the third embodiment, the rotatable member transporting device F includes and utilizes transporting belts B for supporting and transporting the travel wheels 14 of the article transport vehicle 2 similarly to the first embodiment. In addition, each transporting belt B includes the entrance side transporting belt 30, the intermediate transporting belt 31, and the exit side transporting belt 32 similarly to the second embodiment. However, the configurations of the entrance side transporting belt 30 and the exit side transporting belt 32 in the third embodiment are different from those in the second embodiment.

More specifically, as shown in FIG. 10, on each lateral side, the entrance side transporting belt 30 which functions as an entrance side transporting member includes an entrance side upstream transporting belt 30f located on the upstream side in the transporting direction, and an entrance side downstream transporting belt 30r located on the downstream side in the transporting direction, as a plurality of entrance side transport portions located one behind another in the transporting direction.

Similarly, the exit side transporting belt 32 on each lateral side, which functions as an exit side transporting member, includes an exit side upstream transporting belt 32f located on the upstream side in the transporting direction, and an exit side downstream transporting belt 32r located on the downstream side in the transporting direction, as a plurality of exit side transport portions located one behind another in the transporting direction.

The entrance side upstream transporting belt 30f and the entrance side downstream transporting belt 30r are configured such that their respective transport speeds can be individually changed between a predetermined initial low speed and a predetermined final high speed. And the predetermined final high speed of each of the plurality of entrance side transporting belts is set such that the predetermined final high speed of a given entrance side transporting belt is set be equal to the predetermined initial low speed of another entrance side transporting belt that is located immediately downstream of the given entrance side transporting belt in the transporting direction. In the present example, the predetermined final high speed of the entrance side upstream transporting belt 30f is set to be equal to the predetermined initial low speed of the entrance side downstream transporting belt 30r which is located immediately downstream of the entrance side upstream transporting belt 30f in the transporting direction. In addition, the predetermined initial low speed of the entrance side transporting belt (i.e., entrance side upstream transporting belt 30f in the present example) that is located on the most upstream side in the transporting direction is set at the predetermined taking-in low speed described above whereas the predetermined final high speed of the entrance side transporting belt (i.e., entrance side downstream transporting belt 30r in the present example) that is located on the most downstream side in the transporting direction is set at the predetermined taking-out high speed described above.

And each of the entrance side upstream transporting belt 30f and the entrance side downstream transporting belt 30r is configured to gradually increase the transport speed from the predetermined initial low speed set for it toward the predetermined final high speed set for it when the article transport vehicle 2 enters it, and to decrease the transport speed rapidly to the predetermined initial low speed when the article transport vehicle 2 leaves it.

The exit side upstream transporting belt 32f and the exit side downstream transporting belt 32r are configured such that the transport speed can be individually changed between a predetermined initial high speed and a predetermined final low speed. And the predetermined final low speed of each of the plurality of exit side transporting belts is set such that the predetermined final low speed of a given exit side transporting belt is set to be equal to the predetermined initial high speed of another entrance side transporting belt that is located immediately downstream of the given exit side transporting belt in the transporting direction. In the present example, the predetermined final low speed of the exit side upstream transporting belt 32f is set to be equal to the predetermined initial high speed of the exit side downstream transporting belt 32r which is located immediately downstream of the exit side upstream transporting belt 32f in the transporting direction. In addition, the predetermined initial high speed of the exit side transporting belt (i.e., exit side upstream transporting belt 32f in the present example) that is located on the most upstream side in the transporting direction is set at a predetermined taking-in high speed described above whereas the predetermined final low speed of the exit side transporting belt (i.e., exit side downstream transporting belt 32r in the present example) that is located on the most downstream side in the transporting direction is set at the predetermined taking-out low speed described above.

And each of the exit side upstream transporting belt 32f and the exit side downstream transporting belt 32r is configured to gradually decrease the transport speed from the predetermined initial high speed set for it toward the predetermined final low speed set for it when the article transport vehicle 2 enters it, and to increase the transport speed rapidly to the predetermined initial high speed set for it when the article transport vehicle 2 leaves it.

Incidentally, it is determined that the article transport vehicle 2 has entered the entrance side upstream transporting belt 30f or the entrance side downstream transporting belt 30r if both the front and back travel wheels 14 of the article transport vehicle 2 are located in the transport range of the entrance side upstream transporting belt 30f or the entrance side downstream transporting belt 30r respectively. Similarly, it is determined that the article transport vehicle 2 has entered the exit side upstream transporting belt 32f or the exit side downstream transporting belt 32r if both the front and back travel wheels 14 of the article transport vehicle 2 are located in the transport range of the exit side upstream transporting belt 32f or the exit side downstream transporting belt 32r respectively.

In addition, it is determined that the article transport vehicle 2 has left the entrance side upstream transporting belt 30f or the entrance side downstream transporting belt 30r if both the front and back travel wheels 14 of the article transport vehicle 2 have left, or are located outside of, the transport range of the entrance side upstream transporting belt 30*f* or the entrance side downstream transporting belt 30*r* respectively. Similarly, it is determined that the article transport vehicle 2 has left the exit side upstream transporting belt 32*f* or the exit side downstream transporting belt 32*r* if both the front and back travel wheels 14 of the article transport vehicle 2 have left, or are located outside of, the transport range of the exit side upstream transporting belt 32*f* or the exit side downstream transporting belt 32*r* respectively.

In addition, the length of the entrance side upstream transporting belt 30*f* in the travel direction is set to a length in which the transport speed can be changed or increased from the predetermined initial low speed to the predetermined final high speed while the article transport vehicle 2 is traveling on the entrance side upstream transporting belt 30*f*. And the length of the exit side downstream transporting belt 30*r* in the transporting direction is set to a length in which the transport speed can be changed or increased from the predetermined initial low speed to the predetermined final high speed while the article transport vehicle 2 is traveling on the entrance side downstream transporting belt 30*r*. Similarly, the length of the exit side upstream transporting belt 32*f* in the travel direction is set to a length in which the transport speed can be changed or decreased from the predetermined initial high speed to the predetermined final low speed while the article transport vehicle 2 is traveling on the exit side upstream transporting belt 32*f*. And the length of the exit side downstream transporting belt 32*r* in the transporting direction is set to a length in which the transport speed can be changed or decreased from the predetermined initial high speed to the predetermined final low speed while the article transport vehicle 2 is traveling on the exit side downstream transporting belt 32*r*.

With regard to controlling the operation of each of the entrance side upstream transporting belt 30*f* and entrance side downstream transporting belt 30*r* as well as the exit side upstream transporting belt 32*f* and the exit side downstream transporting belt 32*r*, an operation controller which is identical or similar to the operation controller 28 for the transporting belt B of the first embodiment is provided with the operation controller controlling operations of the electric motors which individually drive each belt based on the detected information from the position detector 29.

Therefore, in the present embodiment, the article transport vehicle 2 entering the entrance side portion Kf of the specific section K enters the entrance side upstream transporting belt 30*f*, then leaves the entrance side upstream transporting belt 30*f*, and then enters the entrance side downstream transporting belt 30*r* and leaves the entrance side downstream transporting belt 30*r*, successively or one after the other. During this time, the transport speed of each of the entrance side upstream transporting belt 30*f* and the entrance side downstream transporting belt 30*r* is gradually increased from the predetermined initial low speed set for it toward the predetermined final high speed set for it, thereby causing the transport speed of the travel wheels 14 from the predetermined taking-in low speed to the predetermined taking-out high speed.

Similarly, the article transport vehicle 2 entering the exit side portion Kr of the specific section K enters the exit side upstream transporting belt 32*f*, then leaves the exit side upstream transporting belt 32*f*, and then enters the exit side downstream transporting belt 32*r* and leaves the exit side downstream transporting belt 32*r*, successively or one after the other. During this time, the transport speed of each of the exit side upstream transporting belt 32*f* and the exit side downstream transporting belt 32*r* is gradually decreased from the predetermined initial high speed set for it toward the predetermined final low speed set for it, thereby causing the transport speed of the travel wheels 14 from the predetermined taking-in high speed to the predetermined taking-out low speed.

And the transport speed of each of the entrance side upstream transporting belt 30*f* and the entrance side downstream transporting belt 30*r* is decreased rapidly to the predetermined initial low when the article transport vehicle 2 leaves it. Similarly, the transport speed of each of the exit side upstream transporting belt 32*f* and the exit side downstream transporting belt 32*r* is increased rapidly to the predetermined initial high speed set for it when the article transport vehicle 2 leaves it. Therefore, as shown in FIG. 10, two article transport vehicles 2 can be located in the entrance side portion Kf or in the exit side portion Kr of the specific section K, for example, by allowing a second article transport vehicle 2 to enter the entrance side upstream transporting belt 30*f* after a first article transport vehicle 2 that entered the entrance side upstream transporting belt 30*f* earlier has left the entrance side upstream transporting belt 30*f*.

Note that FIG. 10 shows how the travel speed of the article transport vehicle 2 is gradually increased, then maintained at the constant high speed state, and is subsequently decreased gradually.

Note that, in the third embodiment, an example is described in which the entrance side transporting belt 30, which functions as the entrance side transporting member, includes the entrance side upstream transporting belt 30*f* located on the upstream side in the transporting direction, and the entrance side downstream transporting belt 30*r* located on the downstream side in the transporting direction, as a plurality of entrance side transport portions that are located one behind another in the transporting direction, and in which the exit side transporting belt 32, which functions as the exit side transporting member, includes the exit side upstream transporting belt 32*f* located on the upstream side in the transporting direction, and the exit side downstream transporting belt 32*r* located on the downstream side in the transporting direction, as a plurality of exit side transport portions that are located one behind another in the transporting direction. The entrance side transporting belt 30 may include three or more transporting belts located one behind another in the transporting direction. And the exit side transporting belt 32 may include three or more transporting belts located one behind another in the transporting direction.

As such, the facility of the third embodiment has identical or similar structures and configurations as those in the second embodiment; thus, it offers the same or similar functions, effects, and results as those in the second embodiment. In addition, in the third embodiment, the entrance side portion Kf of the specific section K includes a plurality of entrance side transport portions located one behind another in the transporting direction, and the exit side portion Kr of the specific section K includes a plurality of exit side transport portions located one behind another in the transporting direction; thus, the article transport vehicles 2 can be allowed to travel with a plurality of article transport vehicles 2 located in each of the entrance side portion Kf and the exit side portion Kr of the specific section K unlike in the second embodiment.

Fourth Embodiment

The fourth embodiment is described next, which has a configuration similar to that of the first embodiment except that the configuration of the rotatable member transporting device F is different from that in the first embodiment.

Therefore, only the configuration of the rotatable member transporting device F is described here in order not to duplicate the descriptions of other parts.

In the fourth embodiment, the rotatable member transporting device F utilizes transporting belts B for supporting and transporting the travel wheels 14 of the article transport vehicle 2 as is the case in the first embodiment; however, the structure of the transporting belts B is different from that in the first embodiment.

Specifically, as shown in FIG. 11, the rotatable member transporting device F includes on each lateral side: three entrance side unit transporting belts 33 in the entrance side portion Kf of the specific section K as a plurality of entrance side transporting members; one intermediate unit transporting belt 34 in the intermediate portion Km located between the entrance side portion Kf and the exit side portion Kr as an intermediate transporting member; and three exit side unit transporting belts 35 in the exit side portion Kr as a plurality of exit side transporting members.

The three entrance side unit transporting belts 33 are located one behind another in the transporting direction such that the entrance side unit transporting belt 33 that is closer to the entrance of the specific section K has a lower transport speed. In other words, the transport speed of each of the three entrance side unit transporting belts 33 is set such that the transport speed of a given entrance side unit transporting belt 33 is less than the transport speed of another entrance side unit transporting belt 33 that is located immediately downstream of the given entrance side unit transporting belt 33 in the transporting direction. This arrangement allows the transport speed to be gradually increased in the entrance side portion Kf.

The transport speed of the intermediate unit transporting belt 34 is set at the predetermined high speed so that the transport speed is maintained at the high speed state in the intermediate portion Km located between the entrance side portion Kf and the exit side portion Kr.

The three exit side unit transporting belts 35 are located one behind another in the transporting direction such that the exit side unit transporting belt 33 that is closer to the exit of the specific section K has a lower transport speed. In other words, the transport speed of each of the three exit side unit transporting belts 35 is set such that the transport speed of a given exit side unit transporting belt 35 is greater than the transport speed of another exit side unit transporting belt 35 that is located immediately downstream of the given exit side unit transporting belt 35 in the transporting direction. This arrangement allows the transport speed to be gradually decreased in the exit side portion Kr.

That is, in the fourth embodiment, the article transport vehicle 2 travels on the three entrance side unit transporting belts 33 whose respective transport speeds are set to be sequentially higher, in the entrance side portion Kf of the specific section K, and on the the intermediate unit transporting belt 34 whose transport speed is set at the predetermined high speed, in the intermediate portion Km of the specific section K, and on the three exit side unit transporting belts 35 whose respective transport speeds are set to be sequentially lower, in the exit side portion Kr of the specific section K.

Incidentally, in the fourth embodiment, for example, the transport speeds, in the advancing direction, of the respective portions that the front and back travel wheels 14 respectively contact are different at some moments. For example, as the article transport vehicle 2 enters the entrance side portion Kf of the specific section K, the back travel wheel 14 of the front and back travel wheels 14 on each lateral side is located on the travel surface 1a of the travel rail 1 while the front travel wheel 14 is located on the entrance side unit transporting belt 33 at some moments. And as the article transport vehicle 2 travels in the entrance side portion Kf of the specific section K, the front travel wheel 14 and the back travel wheel 14 on each lateral side are at some moments located on mutually different ones of the three entrance side unit transporting belts 33.

When the transport speeds, in the advancing direction, of the respective portions that the front and back travel wheels 14 respectively contact are different, the stability of the travel of the article transport vehicle 2 can be improved by causing only one of the front and back travel wheels 14 on each lateral side to be driven while allowing the other to rotate freely.

In other words, for example, immediately before the article transport vehicle 2 enters the entrance side portion Kf of the specific section K, the configuration of the article transport vehicle 2 is switched to one in which only one of the front and back travel wheels 14 is driven whereas the other of the wheels 14 is allowed to rotate freely. This configuration is maintained until the article transport vehicle 2 enters the intermediate portion Km of the specific section K. And when the article transport vehicle 2 enters the intermediate portion Km of the specific section K, the configuration is switched to one in which both the front and back travel wheels 14 on each lateral side are driven.

Subsequently, immediately before the article transport vehicle 2 that has been traveling in the intermediate portion Km of the specific section K enters the exit side portion Kr of the specific section K, the configuration of the article transport vehicle 2 is switched to one in which only one of the front and back travel wheels 14 is driven whereas the other of the wheels 14 is allowed to rotate freely. This configuration is maintained until the article transport vehicle 2 exits the exit side portion Kr of the specific section K. And when the article transport vehicle 2 exits the exit side portion Kr of the specific section K, the configuration is switched to one in which both the front and back travel wheels 14 on each lateral side are driven.

Note that FIG. 11 shows how the travel speed of the article transport vehicle 2 is sequentially or gradually increased, then maintained at the constant high speed state, and is subsequently decreased sequentially or gradually.

Incidentally, an example is described in the fourth embodiment in which three entrance side unit transporting belts 33 are provided in the entrance side portion Kf of the specific section K as the plurality of entrance side transporting members while three exit side unit transporting belts 35 are provided in the exit side portion Kr as the plurality of exit side transporting members. However, two entrance side transporting members, or four or more entrance side transporting members may be provided in the entrance side portion Kf of the specific section K as the plurality of entrance side transporting members. Similarly, two exit side transporting member, or four or more exit side transporting members may be provided in the exit side portion Kr as the plurality of exit side transporting members.

As such, the facility of the fourth embodiment has identical or similar configurations as those in the first embodiment; thus, it offers the same or similar functions, effects, and results as those in the first embodiment. In addition, in the fourth embodiment, a plurality of entrance side transporting members arranged one behind another and a plurality of exit side transporting members arranged one behind another are provided in the entrance side portion Kf and in the exit side portion Kr of the specific section K respectively in which the transport speed of each member is not changed; thus, the entire structure can be simplified.

Fifth Embodiment

The fifth embodiment is described next. In the fifth embodiment, while the configuration of the predetermined travel paths L are different from that in the first embodiment, the article transport vehicle 2 is similarly configured to the one in the first embodiment and the rotatable member transporting device F is similarly configured to any one of those in the first to the fourth embodiments.

Therefore, only the configuration of the predetermined travel paths L is described here in order not to duplicate the descriptions of other parts.

Specifically, as shown in FIG. 12, the predetermined travel paths L are set up such that they correspond to the work zone travel path portions LZ in the first embodiment.

And the main travel path 4 includes an elevated path portion 4J located at a higher location, a lower path portion 4S located at a lower location, and an ascending path portion 4U and a descending path portion 4D. Here, a "elevated" means being located at a higher location and a "lower" means being located at a lower location. The ascending path portion 4U is a path which connects together the lower path portion 4S and the elevated path portion 4J, and which is inclined to be gradually higher toward the downstream side of the path. The descending path portion 4D is a path which connects together the elevated path portion 4J and the lower path portion 4S, and which is inclined to be gradually lower toward the downstream side of the path.

In other words, the predetermined travel paths L include the elevated portion and a lower portion because, for example, the ceiling of the clean room is higher in one portion than in another portion. As a result, the main travel path 4 includes an ascending path portion 4U which is inclined to be gradually higher toward the downstream side of the path and descending path portion 4D which is inclined to be gradually lower toward the downstream side of the path.

And in the fifth embodiment, the ascending path portion 4U which is inclined to be gradually higher toward the downstream side of the path is defined to be the specific section K. And this ascending path portion 4U is provided with the rotatable member transporting device F.

Since the article transport vehicle 2 experiences high traveling load while traveling in the ascending path portion 4U, the article transport vehicle 2 cannot travel at higher speeds only by the propelling force obtained with the travel wheels 14. However, since the ascending path portion 4U is provided with the rotatable member transporting device F, the article transport vehicle 2 can be caused to travel at higher speeds with the transporting force from the rotatable member transporting device F.

Other Embodiments

Other embodiments are listed next.

(1) In the first to the fifth embodiments described above, examples are described in which the hoist type article transport vehicles 2 which travel along the travel rails 1 in the ceiling area are provided as article transport vehicles, and in which the present invention is applied to the transporting operations of the hoist type article transport vehicles 2. However, the present invention is applicable also to article transport vehicles of various other configurations, such as carriage type article transport vehicles which travel along travel rails on the floor, or guided carriage type article transport vehicles which autonomously travel on the floor by means of laser guidance etc.

(2) In the first to the fifth embodiments described above, examples are described in which both the front and back travel wheels 14 of the article transport vehicle 2 are drivingly rotated. However, the present invention is applicable also to the article transport vehicle 2 in which only one of the front and back travel wheels 14 on each lateral side is drivingly rotated.

(3) In the first to the fifth embodiments described above, examples are described in which the travel wheels 14 of the article transport vehicle 2 are the propelling rotatable members. However, for example, sprockets that are rotated about respective vertical axes may be provided as propelling rotatable members with the sprockets meshing with rack members which function as contact portions. And a toothed belt which each sprocket can mesh may be provided on each lateral side as the rotatable member transporting device F with the toothed belt being circulated along the path longitudinal direction of the predetermined travel path L.

(4) In the first to the fifth embodiments described above, examples are described in which the rotatable member transporting device F includes and utilizes one or more transporting belts B for supporting and transporting the travel wheels 14. However, the rotatable member transporting device F may include and utilizes one or more conveyors of other configurations, such as a roller conveyor or a slat conveyor for supporting and transporting the travel wheels 14.

(5) In the first to the fifth embodiments described above, examples are described in which the predetermined travel paths L are defined such that a plurality of the secondary travel paths 5 are installed on both sides of each main travel path 4. However, the configuration of the predetermined travel paths L may be changed suitably. For example, a plurality of the secondary travel paths 5 may be installed only on one side of each main travel path 4.

(6) In the second and the third embodiments described above, examples are described in which only one intermediate transporting belt 31 is provided on each lateral side as the intermediate transporting member located between the entrance side portion Kf and the exit side portion Kr of the specific section K. However, a plurality of transporting belts located one behind another in the transporting direction may be provided as the intermediate transporting member.

Similarly, in the fourth embodiment described above, an example is described in which one intermediate unit transporting belt 34 is provided as an intermediate transporting member located between the entrance side portion Kf and the exit side portion Kr of the specific section K. However, a plurality of transporting belts located one behind another in the transporting direction may be provided as the intermediate transporting member.

(7) The specific section K provided in the predetermined travel paths L are not limited to those exemplified in the first to the fifth embodiments described above. And various sections in which the article transport vehicles 2 are required to travel at higher speeds may be defined to be specific sections.

Incidentally, the effects or the results of the present invention is more pronounced when it is applied to a case in which the connecting travel path portion LC in the first embodiment is an ascending path portion which is inclined to be gradually higher toward the downstream side of the path.

Note that, although it is desirable for the predetermined travel path L to extend straight in the specific section K, the path L may be curved as long as the curvature does not prevent the article transport vehicle 2 from traveling at higher speeds.

What is claimed is:

1. An article transport facility comprising:
an article transport vehicle configured to travel along a predetermined travel path by obtaining propelling force by drivingly rotating a propelling rotatable member with the propelling rotatable member in contact with a contact portion;
a rotatable member transporting device which the propelling rotatable member can be in contact with and which transports, in an advancing direction, the propelling rotatable member that is in contact with the rotatable member transporting device, the rotatable member transporting device being provided in place of the contact portion in a specific section included in the predetermined travel path;
wherein the propelling rotatable member is configured to be able to be drivingly rotated while in contact with the rotatable member transporting device.

2. The article transport facility as defined in claim 1, wherein
the propelling rotatable member is a travel wheel that is drivingly rotated with the travel wheel in contact with a travel surface which functions as the contact portion, and
wherein the rotatable member transporting device is configured to support the travel wheel and transport the travel wheel in the advancing direction.

3. The article transport facility as defined in claim 2, wherein
the rotatable member transporting device includes and utilizes a transporting belt having a supporting and transporting surface for supporting the travel wheel and transporting the travel wheel in the advancing direction.

4. The article transport facility as defined in claim 1, wherein
the rotatable member transporting device is configured to gradually increase a transport speed, at which the propelling rotatable member is transported, in an entrance side portion of the specific section, to maintain the transport speed in an intermediate portion located between the entrance side portion and an exit side portion of the specific section, and to gradually decrease the transport speed in the exit side portion.

5. The article transport facility as defined in claim 4, wherein
the rotatable member transporting device includes a plurality of entrance side transporting members located one behind another in an transporting direction in the entrance side portion, an intermediate transporting member located in the intermediate portion, and a plurality of exit side transporting members located one behind another in the transporting direction in the exit side portion,
wherein the transport speed of each of the plurality of entrance side transporting members is set such that the transport speed of a given entrance side transporting member is less than the transport speed of another entrance side transporting member that is located immediately downstream of the given entrance side transporting member in the transporting direction,
wherein the transport speed of the intermediate transporting member is set at a predetermined high speed, and
wherein the transport speed of each of the plurality of exit side transporting members is set such that the transport speed of a given exit side transporting member is greater than the transport speed of another exit side transporting member that is located immediately downstream of the given exit side transporting member in the transporting direction.

6. The article transport facility as defined in claim 4, wherein
the rotatable member transporting device includes an entrance side transporting member located in the entrance side portion, an intermediate transporting member located in the intermediate portion, and an exit side transporting member located in the exit side portion,
wherein the entrance side transporting member is configured to gradually increase the transport speed when the article transport vehicle enters the entrance side transporting member,
wherein the transport speed of the intermediate transporting member is set at a predetermined high speed, and
wherein the exit side transporting member is configured to gradually decrease the transport speed when the article transport vehicle enters the exit side transporting member.

7. The article transport facility as defined in claim 6, wherein
the entrance side transporting member includes a plurality of entrance side transport portions located one behind another in an transporting direction,
wherein each of the plurality of entrance side transport portions is configured to be able to change the transport speed between a predetermined initial low speed and a predetermined final high speed wherein the predetermined final high speed of each of the plurality of entrance side transport portions is set such that the predetermined final high speed of a given entrance side transport portion is set to be equal to the predetermined initial low speed of another entrance side transport portion that is located immediately downstream of the given entrance side transport portion in the transporting direction,
wherein each of the plurality of entrance side transport portions is configured to gradually increase the transport speed from the predetermined initial low speed set for the entrance side transport portion toward the predetermined final high speed set for the entrance side transport portion when the article transport vehicle enters the entrance side transport portion, and to decrease the transport speed to the predetermined initial low speed when the article transport vehicle leaves the entrance side transport portion,
wherein the exit side transporting member includes a plurality of exit side transport portions located one behind another in the transporting direction,
wherein each of the plurality of exit side transport portions is configured to be able to change the transport speed between a predetermined initial high speed and a predetermined final low speed wherein the predetermined final low speed of each of the plurality of exit side transport portions is set such that the predetermined final low speed of a given exit side transport portion is set to be equal to the predetermined initial high speed of another exit side transport portion that is located immediately downstream of the given exit side transport portion in the transporting direction, and
wherein each of the plurality of exit side transport portions is configured to gradually decrease the transport speed from the predetermined initial high speed set for the exit side transport portion toward the predetermined final low speed set for the exit side transport portion when the article transport vehicle enters the exit side transport portion, and to increase the transport speed to the predetermined initial high speed when the article transport vehicle leaves the exit side transport portion.

8. The article transport facility as defined in claim 4, wherein the rotatable member transporting device includes a transporting member that can change the transport speed of the entire transport range of the rotatable member transporting device as a unit, wherein the transporting member is configured:

to increase the transport speed gradually from a predetermined low speed toward a predetermined high speed when the article transport vehicle enters the entrance side portion, to maintain the transport speed at the predetermined high speed when the article transport vehicle is located in the intermediate portion, and to decrease the transport speed gradually from the predetermined high speed toward the predetermined low speed when the article transport vehicle enters the exit side portion.

9. The article transport facility as defined in claim 1, wherein the predetermined travel path includes a work zone travel path portion for transporting articles within each of a plurality of work zones, and a connecting travel path portion which connects the work zone travel path portions, and wherein the specific section is defined in the connecting travel path portion.

10. The article transport facility as defined in claim 1, wherein the predetermined travel path includes an ascending path portion which is inclined to be gradually higher toward a downstream side of the path, and wherein the specific section is defined in the ascending path portion.

* * * * *